United States Patent
Song et al.

(10) Patent No.: US 11,502,458 B2
(45) Date of Patent: Nov. 15, 2022

(54) BACKPLANE CONNECTOR ASSEMBLY WITH IMPROVED SHIELDING EFFECT

(71) Applicant: DONGGUAN LUXSHARE TECHNOLOGIES CO., LTD, Dongguan (CN)

(72) Inventors: Tao Song, Dongguan (CN); Kun Liu, Dongguan (CN); Rongzhe Guo, Dongguan (CN); Chuanqi Gong, Dongguan (CN); Xiaogang Liu, Dongguan (CN); Ming Li, Dongguan (CN)

(73) Assignee: DONGGUAN LUXSHARE TECHNOLOGIES CO., LTD, Dongguan (CN)

( * ) Notice: Subject to any disclaimer, the term of this patent is extended or adjusted under 35 U.S.C. 154(b) by 43 days.

(21) Appl. No.: 17/334,014

(22) Filed: May 28, 2021

(65) Prior Publication Data

US 2021/0399472 A1  Dec. 23, 2021

(30) Foreign Application Priority Data

Jun. 19, 2020  (CN) .......................... 202010567796.4
Jul. 22, 2020  (CN) .......................... 202010709127.6

(51) Int. Cl.
*H01R 4/66* (2006.01)
*H01R 13/6471* (2011.01)
(Continued)

(52) U.S. Cl.
CPC ....... *H01R 13/6471* (2013.01); *H01R 12/585* (2013.01); *H01R 12/716* (2013.01);
(Continued)

(58) Field of Classification Search
CPC .. H01R 12/585; H01R 12/716; H01R 12/724; H01R 12/71; H01R 13/6471;
(Continued)

(56) References Cited

U.S. PATENT DOCUMENTS

| 4,601,527 A | 7/1986 | Lemke |
| 5,664,968 A | 9/1997 | Mickievicz |

(Continued)

FOREIGN PATENT DOCUMENTS

| CA | 2682605 Y | 3/2005 |
| CN | 1244959 A | 2/2000 |

(Continued)

OTHER PUBLICATIONS

Office Action issued in Chinese Patent Application No. 202010709127.6, dated Mar. 26, 2021.

(Continued)

*Primary Examiner* — Khiem M Nguyen
(74) *Attorney, Agent, or Firm* — Birch, Stewart, Kolasch & Birch, LLP

(57) ABSTRACT

A backplane connector assembly includes a first backplane connector and a second backplane connector. The first backplane connector includes a number of first conductive terminals, a first insulating frame, a first metal shield and a second metal shield. The first metal shield includes a first elastic piece, and the second metal shield includes a second elastic piece. The second backplane connector includes a number of second differential signal terminals, an insulating block sleeved on the second differential signal terminals, and a metal shell sleeved on the insulating block. When the first backplane connector is mated with the second backplane connector, the first elastic piece and the second elastic piece (Continued)

are in contact with the metal shell to increase the grounding shielding area, reduce crosstalk and improve the quality of signal transmission.

14 Claims, 44 Drawing Sheets

(51) Int. Cl.

| | |
|---|---|
| H01R 13/40 | (2006.01) |
| H01R 13/6587 | (2011.01) |
| H01R 13/6591 | (2011.01) |
| H01R 13/514 | (2006.01) |
| H01R 13/518 | (2006.01) |
| H01R 12/72 | (2011.01) |
| H01R 13/6586 | (2011.01) |
| H01R 12/58 | (2011.01) |
| H05K 1/11 | (2006.01) |
| H01R 13/6588 | (2011.01) |
| H01R 13/6583 | (2011.01) |
| H01R 13/6585 | (2011.01) |
| H01R 13/6582 | (2011.01) |
| H01R 43/24 | (2006.01) |
| H01R 12/71 | (2011.01) |
| H01R 13/20 | (2006.01) |
| H01R 13/504 | (2006.01) |
| H01R 13/6461 | (2011.01) |
| H01R 13/6584 | (2011.01) |
| H01R 13/6474 | (2011.01) |

(52) U.S. Cl.
CPC ........... *H01R 12/724* (2013.01); *H01R 13/20* (2013.01); *H01R 13/40* (2013.01); *H01R 13/504* (2013.01); *H01R 13/514* (2013.01); *H01R 13/518* (2013.01); *H01R 13/6461* (2013.01); *H01R 13/6582* (2013.01); *H01R 13/6583* (2013.01); *H01R 13/6584* (2013.01); *H01R 13/6585* (2013.01); *H01R 13/6586* (2013.01); *H01R 13/6587* (2013.01); *H01R 13/6588* (2013.01); *H01R 13/6591* (2013.01); *H01R 43/24* (2013.01); *H05K 1/115* (2013.01); *H01R 12/71* (2013.01); *H01R 13/6474* (2013.01)

(58) Field of Classification Search
CPC ............ H01R 13/6474; H01R 13/6591; H01R 13/6588; H01R 13/6587; H01R 13/6586; H01R 13/6585; H01R 13/6584; H01R 13/6583; H01R 13/6582; H01R 13/6461; H01R 13/518; H01R 13/514; H01R 13/504; H01R 13/40; H01R 13/20; H01R 43/24; H05K 1/115
USPC .................................................. 439/108, 701
See application file for complete search history.

(56) References Cited

U.S. PATENT DOCUMENTS

| | | | |
|---|---|---|---|
| 9,350,126 B2 | 5/2016 | Little et al. | |
| 2004/0043658 A1 | 3/2004 | Ko | |
| 2004/0229510 A1 | 11/2004 | Lloyd et al. | |
| 2007/0155239 A1 | 7/2007 | Nakada | |
| 2008/0014798 A1 | 1/2008 | Pan | |
| 2013/0203273 A1 | 8/2013 | Rathburn | |
| 2014/0051295 A1 | 2/2014 | Westman et al. | |
| 2014/0248796 A1 | 9/2014 | Pan | |
| 2014/0295705 A1 | 10/2014 | Lee et al. | |
| 2015/0194771 A1 | 7/2015 | Pan | |
| 2015/0303618 A1 | 10/2015 | Lee et al. | |
| 2015/0318642 A1 | 11/2015 | Lee et al. | |
| 2016/0093985 A1 | 3/2016 | Zhang et al. | |
| 2016/0322760 A1 | 11/2016 | Long et al. | |
| 2018/0166828 A1 | 6/2018 | Gailus | |

FOREIGN PATENT DOCUMENTS

| | | | |
|---|---|---|---|
| CN | 2513252 Y | 9/2002 | |
| CN | 2571026 Y | 9/2003 | |
| CN | 1491465 A | 4/2004 | |
| CN | 1592990 A | 3/2005 | |
| CN | 101159354 A | 4/2008 | |
| CN | 201142392 Y | 10/2008 | |
| CN | 101330172 A | 12/2008 | |
| CN | 101527409 A | 9/2009 | |
| CN | 101542640 A | 9/2009 | |
| CN | 101728667 A | 6/2010 | |
| CN | 101459299 B | 11/2010 | |
| CN | 102088148 A | 6/2011 | |
| CN | 102290653 A | 12/2011 | |
| CN | 102468562 A | 5/2012 | |
| CN | 202395246 U | 8/2012 | |
| CN | 102694308 A | 9/2012 | |
| CN | 102969621 A | 3/2013 | |
| CN | 103151650 A | 6/2013 | |
| CN | 103247918 A | 8/2013 | |
| CN | 103296546 A | 9/2013 | |
| CN | 103311746 A | 9/2013 | |
| CN | 203589266 U | 5/2014 | |
| CN | 103928795 A | 7/2014 | |
| CN | 103988371 A | 8/2014 | |
| CN | 104037551 A | 9/2014 | |
| CN | 104241975 A | 12/2014 | |
| CN | 104396095 A | 3/2015 | |
| CN | 104505678 A | 4/2015 | |
| CN | 104577406 A | 4/2015 | |
| CN | 204304028 U | 4/2015 | |
| CN | 104779487 A | 7/2015 | |
| CN | 104810657 A | 7/2015 | |
| CN | 105024230 A | 11/2015 | |
| CN | 105470679 A | 4/2016 | |
| CN | 105470732 A | 4/2016 | |
| CN | 105470736 A | 4/2016 | |
| CN | 105612664 A | 5/2016 | |
| CN | 105703159 A | 6/2016 | |
| CN | 105742854 A | 7/2016 | |
| CN | 105958245 A | 9/2016 | |
| CN | 106207569 A | 12/2016 | |
| CN | 205846279 U | 12/2016 | |
| CN | 107104329 A | 8/2017 | |
| CN | 104009303 B | 1/2018 | |
| CN | 107565279 A | 1/2018 | |
| CN | 207530119 U | 6/2018 | |
| CN | 109390806 A | 2/2019 | |
| CN | 109546384 A | 3/2019 | |
| CN | 109546388 A | 3/2019 | |
| CN | 109586086 A | 4/2019 | |
| CN | 109599724 A | 4/2019 | |
| CN | 109659726 A | 4/2019 | |
| CN | 109841981 A | 6/2019 | |
| CN | 109950721 A | 6/2019 | |
| CN | 208955335 U | 6/2019 | |
| CN | 209056665 U | 7/2019 | |
| CN | 110185448 A | 8/2019 | |
| CN | 110247233 A | 9/2019 | |
| CN | 110299649 A | 10/2019 | |
| CN | 110323622 A | 10/2019 | |
| CN | 110544850 A | 12/2019 | |
| CN | 110600943 A | 12/2019 | |
| CN | 110649407 A | 1/2020 | |
| CN | 110718815 A | 1/2020 | |
| CN | 110808499 A | 2/2020 | |
| CN | 110838635 A | 2/2020 | |
| CN | 111092342 A | 5/2020 | |
| CN | 111370890 A | 7/2020 | |
| CN | 111682366 A | 9/2020 | |
| JP | 2000-058172 A | 2/2000 | |
| TW | 415133 B | 12/2000 | |
| TW | 459428 B | 10/2001 | |

(56) References Cited

FOREIGN PATENT DOCUMENTS

| | | |
|---|---|---|
| TW | M461166 U1 | 9/2013 |
| TW | I414111 B | 11/2013 |
| TW | I452767 B | 9/2014 |
| TW | I545845 B | 8/2016 |
| TW | 201733225 A | 9/2017 |
| TW | I600231 B | 9/2017 |
| TW | I528659 B | 4/2018 |
| TW | I623154 B | 5/2018 |
| TW | 201841440 A | 11/2018 |
| TW | I648925 B | 1/2019 |
| TW | M585436 U | 10/2019 |
| TW | 201943158 A | 11/2019 |
| TW | M591270 U | 2/2020 |
| TW | M593091 U | 4/2020 |
| WO | WO 2016/168820 A1 | 10/2016 |
| WO | WO 2017/106266 A1 | 6/2017 |

OTHER PUBLICATIONS

Office Action issued in Chinese Patent Application No. 202010709180. 6, dated Mar. 30, 2021.
Office Action issued in Chinese Patent Application No. 202010710402. 6, dated Mar. 3, 2021.
Office Action issued in Chinese Patent Application No. 202010710463. 2, dated Mar. 25, 2021.
Office Action issued in Chinese Patent Application No. 202010931721. X, dated Mar. 25, 2021.
Office Action issued in Taiwanese Patent Application No. 109128295, dated Apr. 14, 2021.
Office Action issued in Taiwanese Patent Application No. 109129938, dated Apr. 15, 2021.

BACKPLANE CONNECTOR ASSEMBLY WITH IMPROVED SHIELDING EFFECT

CROSS-REFERENCE TO RELATED APPLICATIONS

This patent application claims priority of a Chinese Patent Application No. 202010567796.4, filed on Jun. 19, 2020 and titled "BACKPLANE CONNECTOR ASSEMBLY", and a Chinese Patent Application No. 202010709127.6, filed on Jul. 22, 2020 and titled "BACKPLANE CONNECTOR ASSEMBLY", the entire content of which is incorporated herein by reference.

TECHNICAL FIELD

The present disclosure relates to a backplane connector assembly which belongs to a technical field of connectors.

BACKGROUND

Existing backplane connector assemblies usually include a male connector and a female connector. The male connector usually includes a male housing and a plurality of male wafers mounted to the male housing. Each male wafer includes a first insulating frame, a plurality of male conductive terminals insert-molded with the first insulating frame, and a first metal shield located on at least one side of the first insulating frame. The female connector usually includes a female housing and a plurality of female wafers mounted to the female housing. Each female wafer includes a second insulating frame, a plurality of female conductive terminals insert-molded with the second insulating frame, and a second metal shield located on at least one side of the second insulating frame.

When the male connector and the female connector are mated, the male conductive terminals and the female conductive terminals are in contact with each other, and the first metal shield and the second metal shield are mated with each other.

However, with the continuous improvement of the signal transmission requirements of high-speed connectors, there is still room for improvement in the shielding of the differential signal terminals of the existing backplane connector assemblies.

SUMMARY

An object of the present disclosure is to provide a backplane connector assembly with improved shielding effect.

In order to achieve the above object, the present disclosure adopts the following technical solution: a backplane connector assembly, comprising a first backplane connector and a second backplane connector mateable with the first backplane connector. The first backplane connector comprises a first wafer. The first wafer comprises a plurality of first conductive terminals each comprising a first connection portion and a first contact portion; a first insulating frame, the first insulating frame being fixed with the first connection portion; a first metal shield, the first metal shield comprising a first extension portion; and a second metal shield, the second metal shield comprising a second extension portion. Wherein the first conductive terminals comprise first differential signal terminals, a first ground terminal and a second ground terminal; and wherein the first differential signal terminals are located between the first ground terminal and the second ground terminal. The second backplane connector comprises a second wafer. The second wafer comprises a plurality of second conductive terminals each comprising a second connection portion and a second contact portion; a second insulating frame, the second insulating frame being fixed with the second connection portion; a third metal shield, the third metal shield comprising a third extension portion; and a fourth metal shield, the fourth metal shield comprising a fourth extension portion. Wherein the second conductive terminals comprise second differential signal terminals, a third ground terminal and a fourth ground terminal; and wherein the second differential signal terminals are located between the third ground terminal and the fourth ground terminal. Wherein the first extension portion comprises a first elastic piece, and the second extension portion comprises a second elastic piece. Wherein the second contact portions of the second differential signal terminals extend beyond the third extension portion and the fourth extension portion, the second wafer comprises an insulating block sleeved on the second contact portions of the second differential signal terminals and a metal shell sleeved on the insulating block, and the metal shell is in contact with the third extension portion and the fourth extension portion. Wherein when the first backplane connector is mated with the second backplane connector, the first contact portions are in contact with the second contact portions, and the first elastic piece and the second elastic piece are respectively in contact with the metal shell.

Compared with the prior art, the second backplane connector of the present disclosure includes a metal shell sleeved on the insulating block. When the first backplane connector is mated with the second backplane connector, both the first elastic piece of the first metal shield and the second elastic piece of the second metal shield are in contact with the metal shell, thereby increasing the grounding shielding area, reducing crosstalk and improving the quality of signal transmission.

DETAILED DESCRIPTION

Figure 1:
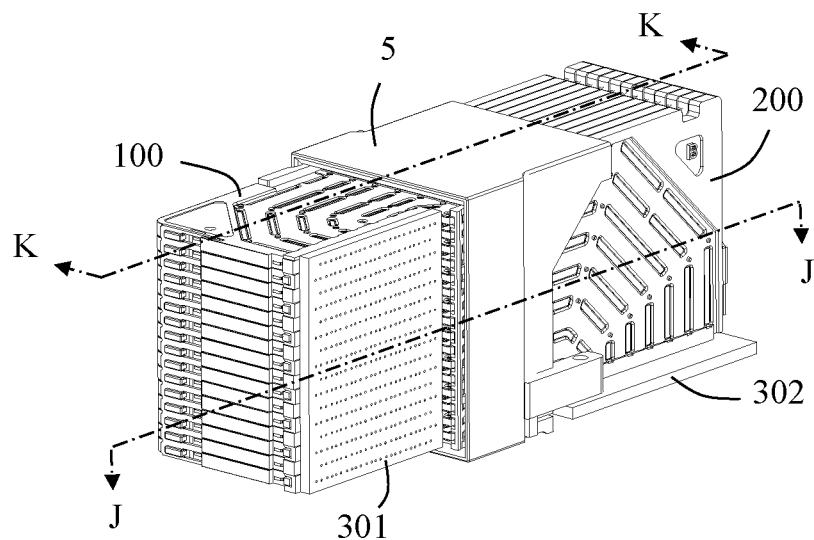
FIG. 1 is a perspective view of a backplane connector assembly in accordance with an embodiment of the disclosure.

Exemplary embodiments will be described in detail here, examples of which are shown in drawings. When referring to the drawings below, unless otherwise indicated, same numerals in different drawings represent the same or similar elements. The examples described in the following exemplary embodiments do not represent all embodiments consistent with this application. Rather, they are merely examples of devices and methods consistent with some aspects of the application as detailed in the appended claims.

The terminology used in this application is only for the purpose of describing particular embodiments, and is not intended to limit this application. The singular forms "a", "said", and "the" used in this application and the appended claims are also intended to include plural forms unless the context clearly indicates other meanings.

It should be understood that the terms "first", "second" and similar words used in the specification and claims of this application do not represent any order, quantity or importance, but are only used to distinguish different components. Similarly, "an" or "a" and other similar words do not mean a quantity limit, but mean that there is at least one; "multiple" or "a plurality of" means two or more than two. Unless otherwise noted, "front", "rear", "lower" and/or "upper" and similar words are for ease of description only and are not limited to one location or one spatial orientation. Similar words such as "include" or "comprise" mean that elements or objects appear before "include" or "comprise" cover elements or objects listed after "include" or "comprise" and their equivalents, and do not exclude other elements or objects. The term "a plurality of" mentioned in the present disclosure includes two or more.

Hereinafter, some embodiments of the present disclosure will be described in detail with reference to the accompanying drawings. In the case of no conflict, the following embodiments and features in the embodiments can be combined with each other.

Figure 2:
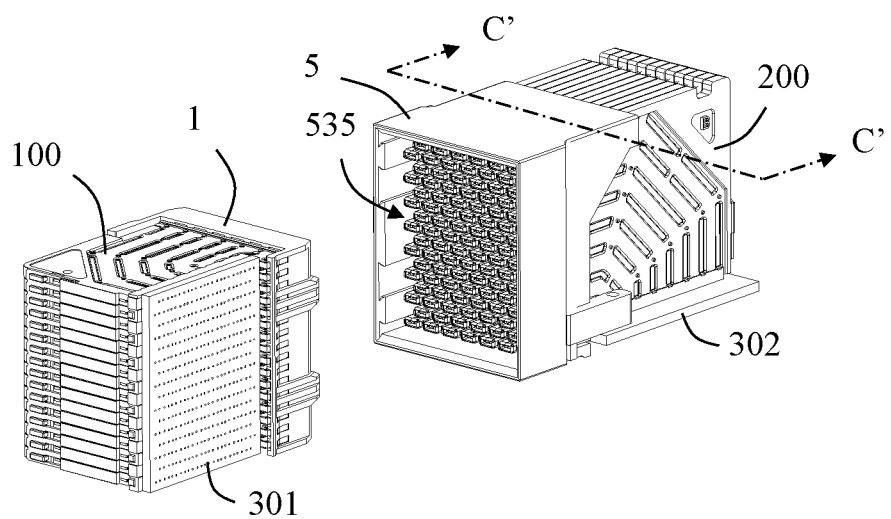
FIG. 2 is a partial perspective exploded view of FIG. 1.

Referring to FIGS. 1 and 2, an embodiment of the present disclosure discloses a backplane connector assembly which includes a first backplane connector 100, a second backplane connector 200 for mating with the first backplane connector 100, a first circuit board 301 mounted with the first backplane connector 100, and a second circuit board 302 mounted with the second backplane connector 200. In the illustrated embodiment of the present disclosure, the first backplane connector 100 and the second backplane connector 200 are mated in an orthogonal manner. The first circuit board 301 is perpendicular to the second circuit board 302.

Referring to FIGS. 3 to 6, the first backplane connector 100 includes a first header 1, a plurality of first wafers 2 assembled to the first header 1, a first spacer 3 fixed at a rear end of the plurality of first wafers 2, and a first mounting block 4 mounted at a bottom end of the plurality of first wafers 2.

Figure 7:
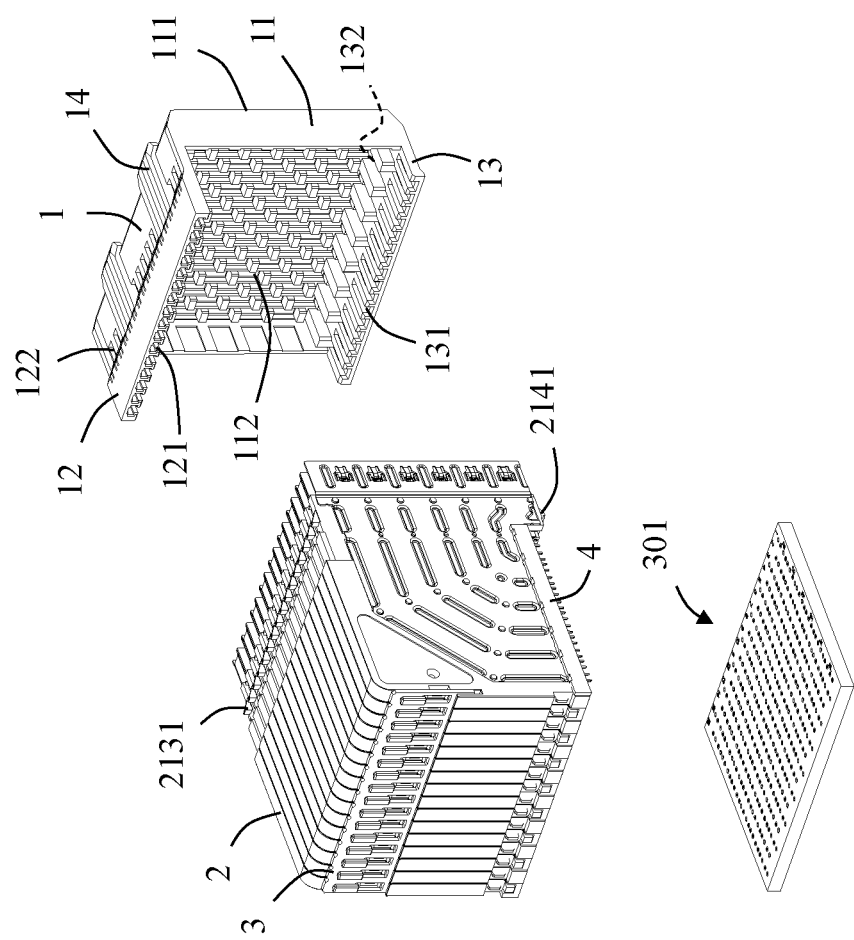
FIG. 7 is a partially exploded perspective view of FIG. 5.
Figure 8:
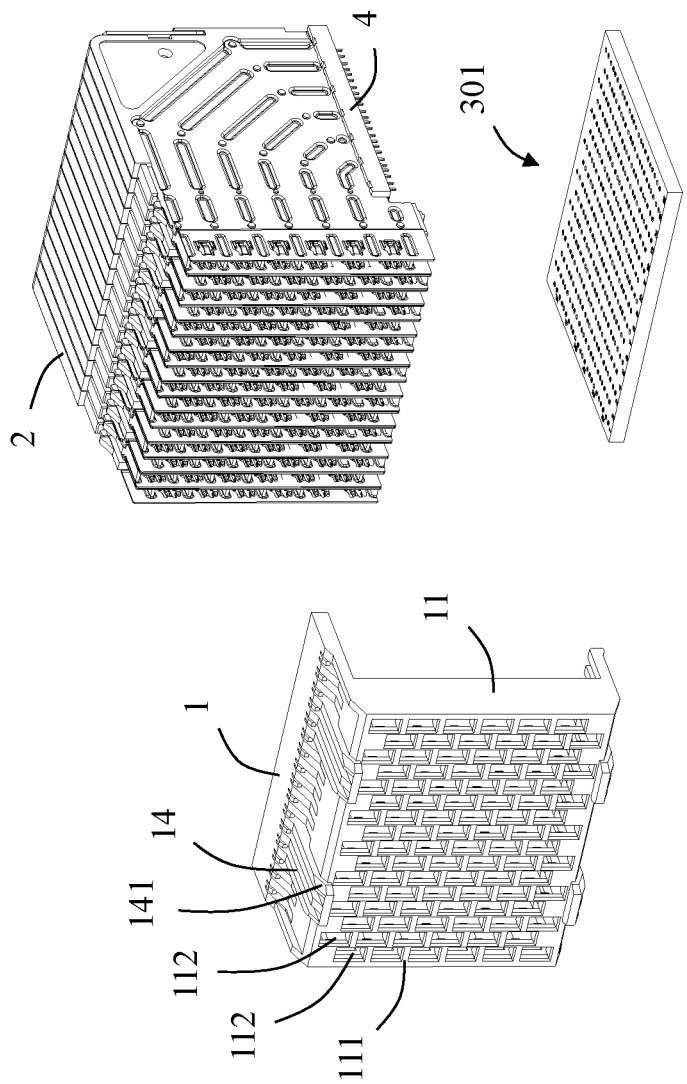
FIG. 8 is a partial perspective exploded view of FIG. 7 from another angle.

Referring to FIGS. 7 and 8, in an embodiment of the present disclosure, the first header 1 is made of insulating material. The first header 1 includes a first body portion 11, a first wall portion 12 extending rearwardly from one side of the first body portion 11, and a second wall portion 13 extending rearwardly from the other side of the first body portion 11. The first wall portion 12 and the second wall portion 13 are in parallel. The first body portion 11 includes a mating surface 111 and a plurality of first terminal receiving grooves 112 extending through the mating surface 111. As shown in FIGS. 7 and 8, in the illustrated embodiment of the present disclosure, the first terminal receiving grooves 112 are disposed in multiple rows along a left-right direction, wherein two adjacent rows of first terminal receiving grooves 112 are staggered in a vertical direction. That is, in two adjacent rows of first terminal receiving grooves 112, the first terminal receiving grooves 112 at corresponding positions are not in alignment in the left-right direction. The first wall portion 12 includes a plurality of first slots 121 and a plurality of first locking grooves 122 communicating with corresponding first slots 121. The second wall portion 13 includes a plurality of second slots 131 and a plurality of second locking grooves 132 communicating with corresponding second slots 131. The first locking grooves 122 and the second locking grooves 132 extend outwardly along the vertical direction through the first wall portion 12 and the second wall portion 13, respectively. The first locking grooves 122 and the second locking grooves 132 are adapted to lock with the first wafers 2 in order to prevent the first wafers 2 from being separated from the first header 1. The first slot 121, the second slot 131 and the first terminal receiving grooves 112 which are in alignment with each other along the vertical direction are used to receive the same first wafer 2.

Besides, referring to FIG. 8, the first header 1 also includes a plurality of positioning protrusions 14 extending forwardly from the first wall portion 12 and the second wall portion 13, respectively. The positioning protrusions 14 protrude beyond the mating surface 111. Each positioning protrusion 14 includes a guiding inclined surface 141 formed at an end thereof.

Figure 15:
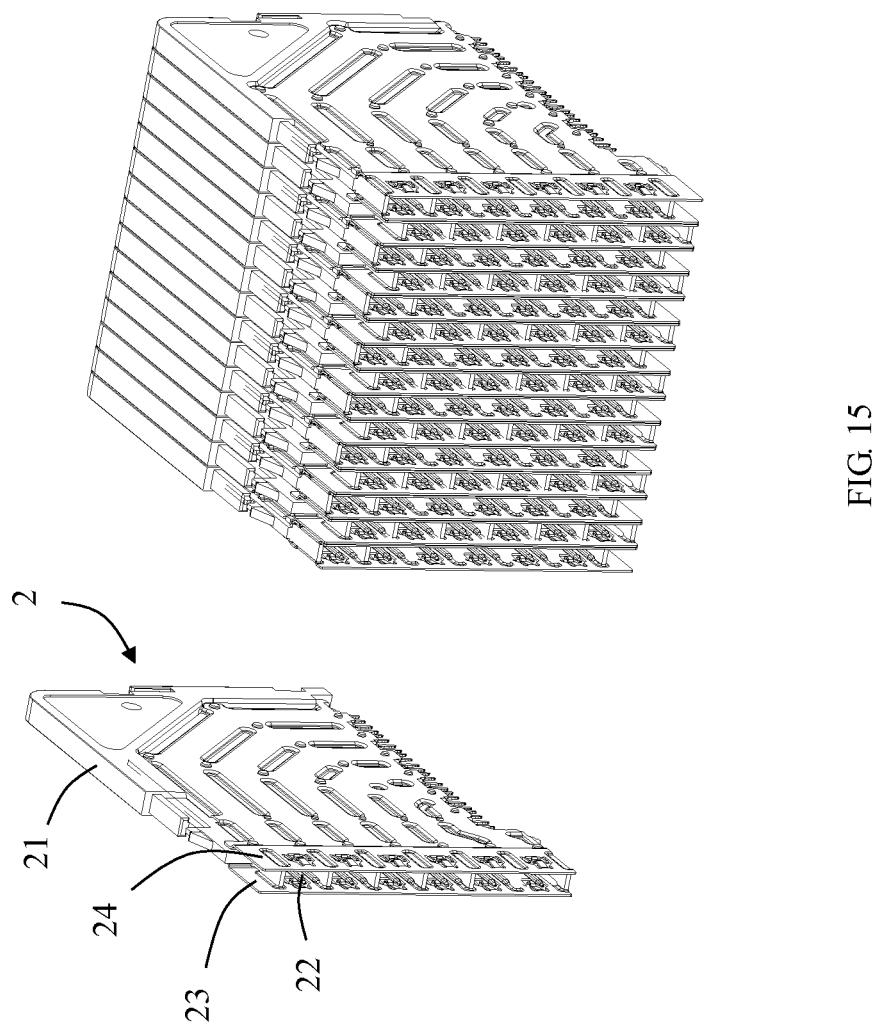
FIG. 15 is a partial perspective exploded view of the first backplane connector of the present disclosure, in which one of the first wafers is separated.

Referring to FIG. 15, the first wafer 2 includes a first insulating frame 21, a plurality of first conductive terminals 22 fixed to the first insulating frame 21, a first metal shield 23 fixed on one side of the first insulating frame 21, and a second metal shield 24 fixed on the other side of the first insulating frame 21.

Figure 18:
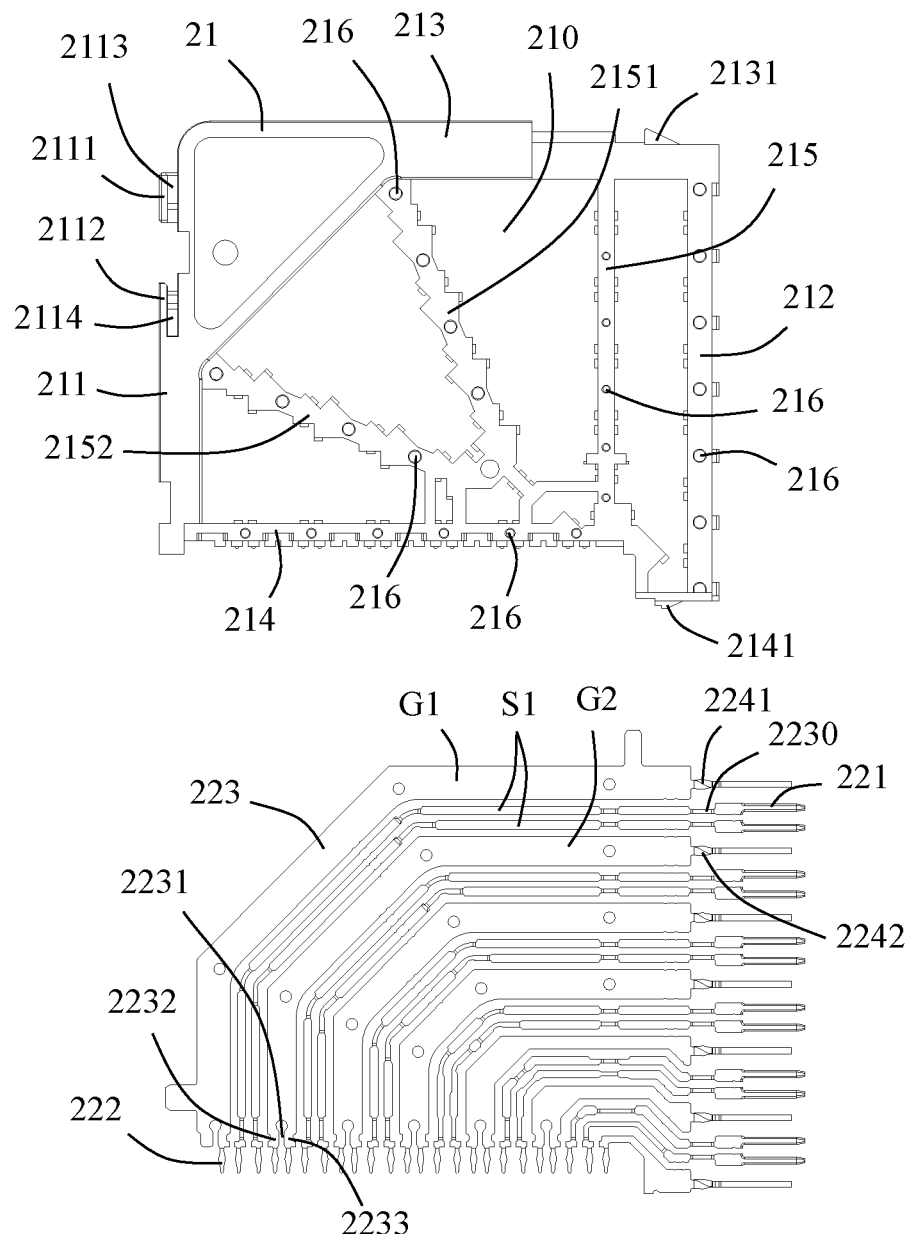
FIG. 18 is a side view of the first insulating frame when separated from the first conductive terminals.

Referring to FIG. 18, each first insulating frame 21 is roughly frame-shaped and includes a first rear wall 211, a first front wall 212 opposite to the first rear wall 211, a first top wall 213 connecting one end of the first rear wall 211 and one end of the first front wall 212, a first bottom wall 214 connecting the other end of the first rear wall 211 and the other end of the first front wall 212, and a plurality of connecting walls 215. The connecting walls 215 are capable of enhancing the structural strength of the frame. The first rear wall 211 includes a first protrusion 2111 and a second protrusion 2112 which protrude rearwardly. The first protrusion 2111 and the second protrusion 2112 are spaced apart from each other along the vertical direction. The first protrusion 2111 and the second protrusion 2112 are in alignment with each other along the vertical direction. The first protrusion 2111 includes a first constriction portion 2113, and the second protrusion 2112 includes a second constriction portion 2114. In the illustrated embodiment of the present disclosure, the first insulating frame 21 includes a first hollow portion 210. The connecting walls 215 include a first connecting wall 2151 connecting the first top wall 213 and the first bottom wall 214, and a second connecting wall 2152 connecting the first rear wall 211 and the first bottom wall 214. The first connecting wall 2151 and the second connecting wall 2152 are exposed in the first hollow portion 210. The first top wall 213 includes a first locking protrusion 2131 for being inserted into the first locking groove 122. The first bottom wall 214 includes a second locking protrusion 2141 for being inserted into the second locking groove 132.

Figure 16:
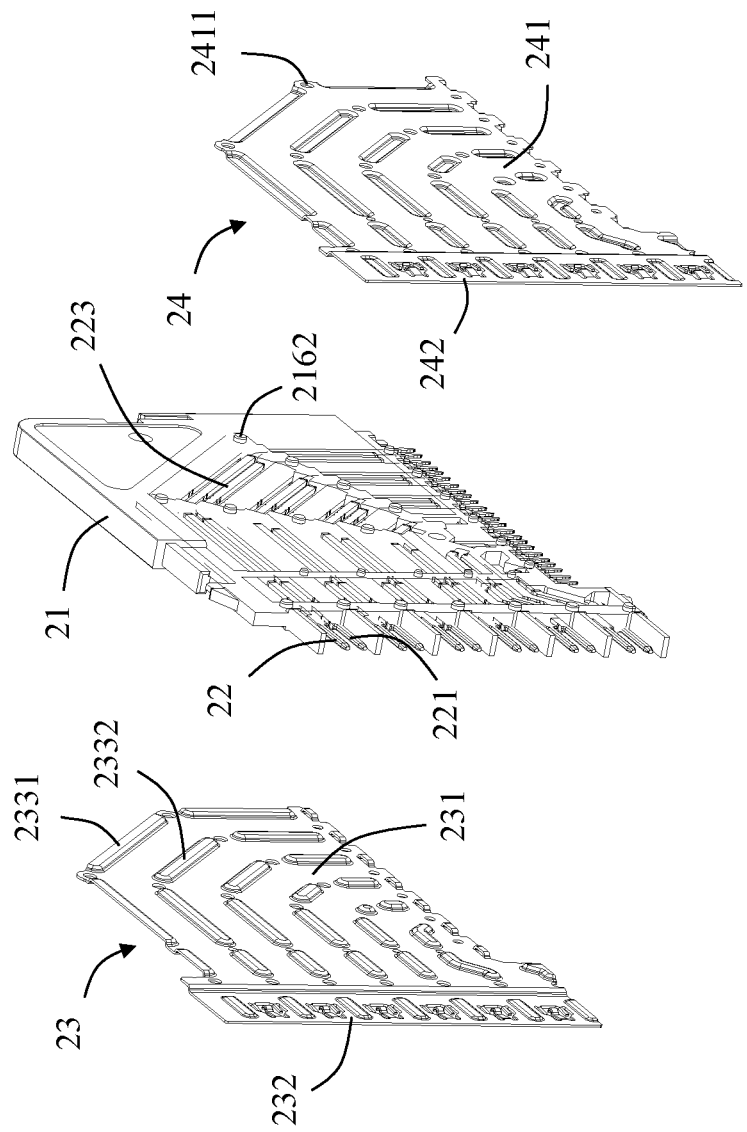
FIG. 16 is a partial perspective exploded view of the first wafer in FIG. 15.
Figure 17:
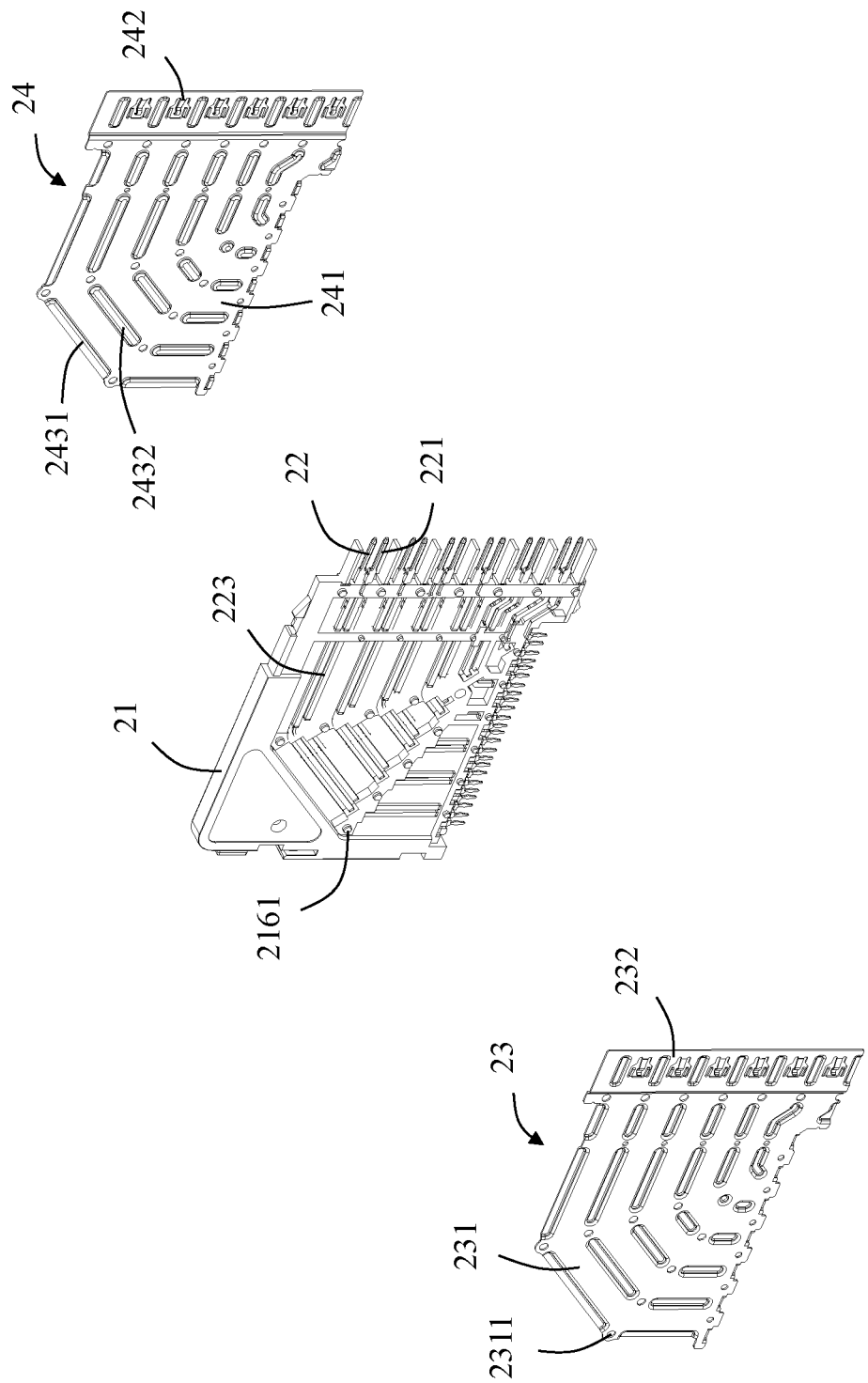
FIG. 17 is a partially exploded perspective view of FIG. 16 from another angle.

Referring to FIGS. 16 to 18, the first insulating frame 21 further includes a plurality of posts 216 for fixing the first metal shield 23 and the second metal shield 24. In the illustrated embodiment of the present disclosure, the posts 216 are disposed on the first bottom wall 214, the first connecting wall 2151, the second connecting wall 2152 and the first front wall 212. The first metal shield 23 and the second metal shield 24 are located on opposite sides of the first insulating frame 21, respectively. The posts 216 include a plurality of first posts 2161 and a plurality of second posts 2162. The first posts 2161 and the second posts 2162 are located on opposite sides of the first insulating frame 21, respectively, so as to be fixed and positioned with the first metal shield 23 and the second metal shield 24.

Referring to FIG. 18, each first conductive terminal 22 includes a first contact portion 221, a first tail portion 222 and a first connection portion 223 connecting the first contact portion 221 and the first tail portion 222. Some of the first contact portions 221 are used to electrically connect with the second backplane connector 200. The first tail portions 222 are used for being mounted to the first circuit board 301. In the illustrated embodiment of the present disclosure, the first contact portion 221 is substantially perpendicular to the first tail portion 222. The first connection portion 223 is of a curved configuration.

Each group of first conductive terminals 22 include a plurality of first ground terminals G1, a plurality of second ground terminals G2, and a plurality of first signal terminals S1. In the illustrated embodiment of the present disclosure, two adjacent first signal terminals S1 form a pair of first differential signal terminals. Each pair of first differential signal terminals are located between one first ground terminal G1 and one second ground terminal G2. That is, each group of first conductive terminals 22 are arranged in a manner of G1-S1-S1-G2, which is beneficial to improve the quality of signal transmission. The first differential signal terminals are narrow-side coupling or wide-side coupling. A width of the first ground terminal G1 and a width of the second ground terminal G2 are greater than a width of each first signal terminal S1 which is located between the first ground terminal G1 and the second ground terminal G2. Therefore, it is beneficial to increase the shielding area and improve the shielding effect.

In the illustrated embodiment of the present disclosure, the first connection portions 223 of the first conductive terminals 22 are partially insert-molded with the first insulating frame 21. Each first connection portion 223 of the first signal terminal S1 has a narrowed portion 2230 insert-molded with the first insulating frame 21 so as to adjust the impedance of the first signal terminal S1 for achieving impedance matching. In the illustrated embodiment of the present disclosure, the first contact portion 221 of the first signal terminal S1 is substantially needle-shaped. The first contact portion 221 of the first ground terminal G1 and the first contact portion 221 of the second ground terminal G2 are substantially rectangular-shaped. The first contact portion 221 of the first signal terminal S1 and the first connection portion 223 of the first conductive terminal 22 are both coplanar, which means they are located in a same first plane (for example, a horizontal plane). It should be noted that the technical term "coplanar" used in the present disclosure is intended to indicate that related components are substantially flush, which includes situations of incomplete coplanarity caused by manufacturing tolerances. In the illustrated embodiment of the present disclosure, the first ground terminal G1 includes a first torsion portion 2241 connecting its first contact portion 221 and its first tail portion 222, so that the first contact portion 221 of the first ground terminal G1 is located in a second plane (for example, a vertical plane) perpendicular to the first plane. The second ground terminal G2 includes a second torsion portion 2242 connecting its first contact portion 221 and its first tail portion 222, so that the first contact portion 221 of the second ground terminal G2 is also located in the second plane (for example, the vertical plane) perpendicular to the first plane. The first contact portion 221 of the first ground terminal G1 and the first contact portion 221 of the second ground terminal G2 are parallel to each other. Each first connection portion 223 of the first ground terminals G1 and the second ground terminals G2 further includes a slot 2231 adjacent to its corresponding first tail portion 222. The slot 2231 extend through a bottom edge of the first connection portion 223, so that the first connection portions 223 is divided into a first end portion 2232 and a second end portion 2233.

Figure 24:
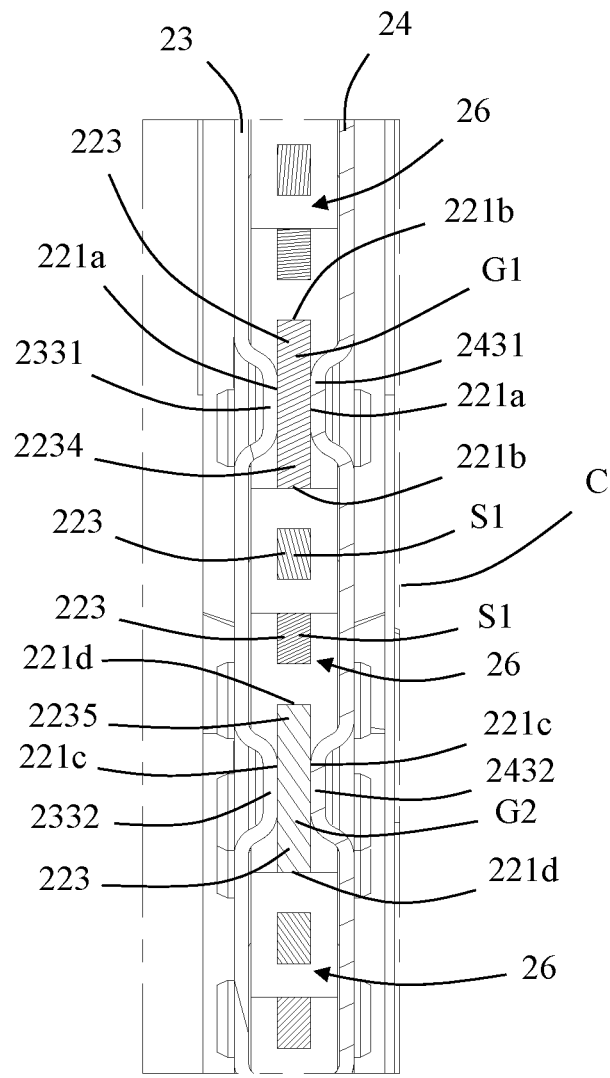
FIG. 24 is a partial enlarged view of a frame part C in FIG. 23.
Figure 26:
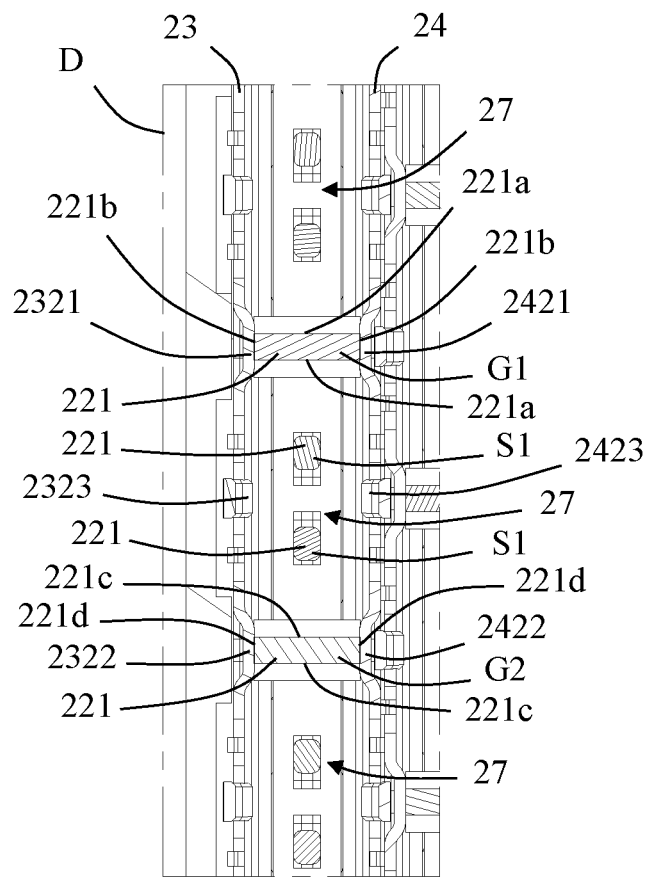
FIG. 26 is a partial enlarged view of a frame part D in FIG. 25.
Figure 27:
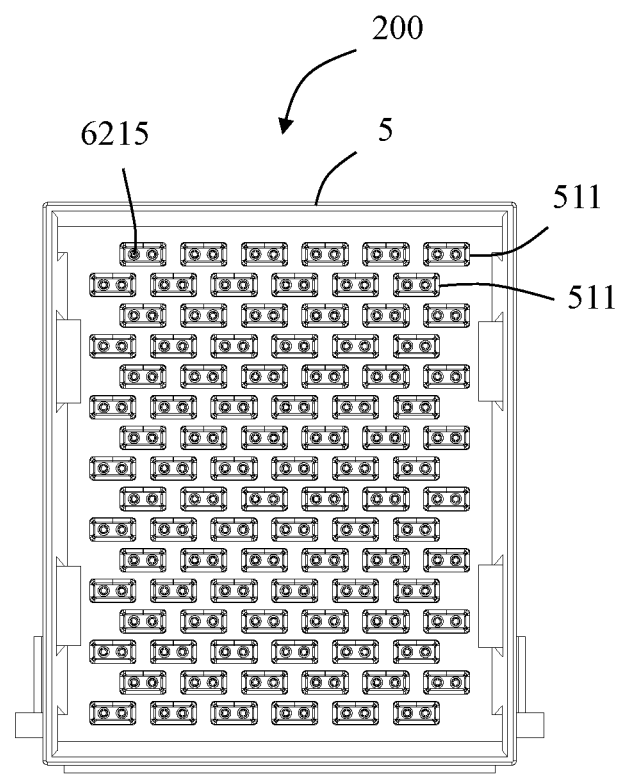
FIG. 27 is a front view of a second backplane connector in accordance with an embodiment of the present disclosure.

Referring to FIGS. 24 and 26, in the illustrated embodiment of the present disclosure, the first contact portion 221 and the first connection portion 223 of the first ground terminal G1 have a first wide surface 221a and a first narrow surface 221b perpendicular to the first wide surface 221a. The first contact portion 221 and the first connection portion 223 of the second ground terminal G2 have a second wide surface 221c and a second narrow surface 221d perpendicular to the second wide surface 221c. The first connection portions 223 of each pair of first differential signal terminals are located between the first narrow surface 221b of the first ground terminal G1 and the second narrow surface 221d of the second ground terminal G2 which are located on opposite sides of the first connection portions 223 of each pair of first differential signal terminals. The first contact portions 221 of each pair of first differential signal terminals are located between the first wide surface 221a of the first ground terminal G1 and the second wide surface 221c of the second ground terminal G2 which are located on opposite sides of the first contact portions 221 of each pair of first differential signal terminals. In the illustrated embodiment of the present disclosure, a width of the first wide surface 221a and a width of the second wide surface 221c are greater than a width of each first contact portion 221 of the first signal terminals S1, thereby better shielding can be provided for the first contact portions 221 of the first signal terminals S1.

Figure 19:
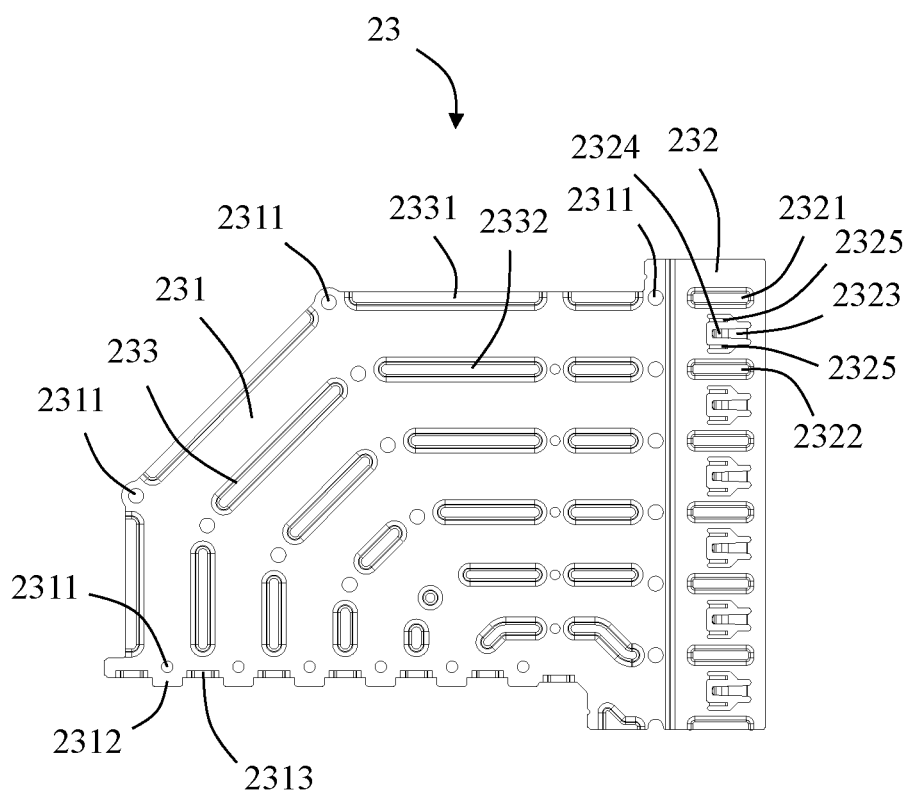
FIG. 19 is a side view of the first metal shield of the first backplane connector.

In the illustrated embodiment of the present disclosure, the first metal shield 23 and the second metal shield 24 are symmetrically disposed on opposite sides of the first insulating frame 21. Referring to FIGS. 17 and 19, the first metal shield 23 includes a first main body portion 231 and a first extension portion 232 extending from the first main body portion 231. The first main body portion 231 is located on one side of the first connection portions 223 of the first conductive terminals 22. The first extension portion 232 is located on one side of the first contact portions 221 of the first conductive terminals 22. In the illustrated embodiment of the present disclosure, the first extension portion 232 and the first main body portion 231 are located in different planes, in which the first extension portion 232 is farther away from the second metal shield 24 than the first main body portion 231. The first main body portion 231 includes a plurality of first mounting holes 2311 for mating with the plurality of first posts 2161. The first posts 2161 are fixed and positioned in the first mounting holes 2311 by soldering, thereby the fixing and positioning of the first metal shield 23 and the first insulating frame 21 are realized. The first main body 231 includes a plurality of ribs 233. The ribs 233 include a plurality of first ribs 2331 protruding toward the first ground terminals G1 and a plurality of second ribs 2332 protruding toward the second ground terminals G2. The first ribs 2331 corresponding to the first ground terminal G1 are disposed along an extending direction of the first connection portion 223 of the first ground terminal G1. The second ribs 2332 corresponding to the second ground terminal G2 are disposed along an extending direction of the first connection portion 223 of the second ground terminal G2. In the illustrated embodiment of the present disclosure, the first ribs 2331 and the second ribs 2332 are formed by stamping the first main body portion 231. The first ribs 2331 and the second ribs 2332 protrude toward the second metal shield 24. The first ribs 2331 and the second ribs 2332 are discontinuously disposed along the extending direction of the first connection portion 223 of the first ground terminal G1 and the extending direction of the first connection portion 223 of the second ground terminal G2, respectively, so as to achieve multi-position contact. In order to improve the reliability of the contact between the first metal shield 23 and the first ground terminals G1 and the second ground terminals G2. In the illustrated embodiment of the present disclosure, referring to FIG. 22, a wall thickness of the first rib 2331, a wall thickness of the second rib 2332, and a wall thickness of a portion of the first main body 231 located between the first rib 2331 and the second rib 2332 are the same.

The first extension portion 232 includes a plurality of first bulges 2321 protruding toward the corresponding first contact portions 221 of the first ground terminals G1, a plurality of second bulges 2322 protruding toward the corresponding first contact portions 221 of the second ground terminals G2, and a plurality of first elastic pieces 2323 each of which is located between adjacent first bulge 2321 and second bulge 2322. The first elastic pieces 2323 extend along directions toward the first main body portion 231. Each first elastic piece 2323 has an arc-shaped contact portion 2324. In the illustrated embodiment of the present disclosure, the first extension portion 232 further includes two first protruding tabs 2325 located at opposite sides of each first elastic piece 2323. The first protruding tabs 2325 and the first elastic pieces 2323 extend along opposite directions. The first protruding tabs 2325 protrude sidewardly to contact the adjacent first wafer 2 so as to improve the shielding effect. In the illustrated embodiment of the present disclosure, referring to FIG. 26, a wall thickness of the first bulge 2321, a wall thickness of the second bulge 2322 and a wall thickness of a portion of the first extension portion 232 located between the first bulge 2321 and the second bulge 2322 are the same.

In addition, the first main body portion 231 further includes a plurality of first protruding pieces 2312 extending downwardly from a bottom edge thereof and a plurality of connecting pieces 2313 each of which is located between two adjacent first protruding pieces 2312. By providing the first protruding pieces 2312, the shielding length can be extended, and the shielding effect of the first signal terminals S1 can be improved. In the illustrated embodiment of the present disclosure, the connecting pieces 2313 are stamped from the first main body portion 231. Each connecting piece 2313 straddles the corresponding slot 2231 to connect one side of the first end portion 2232 and the second end portion 2233 of the same first ground terminal G1, thereby improving the shielding effect. At the same time, each connecting piece 2313 can also connect one side of the first end portion 2232 and the second end portion 2233 of the same second ground terminal G2, thereby improving the shielding effect.

Figure 20:
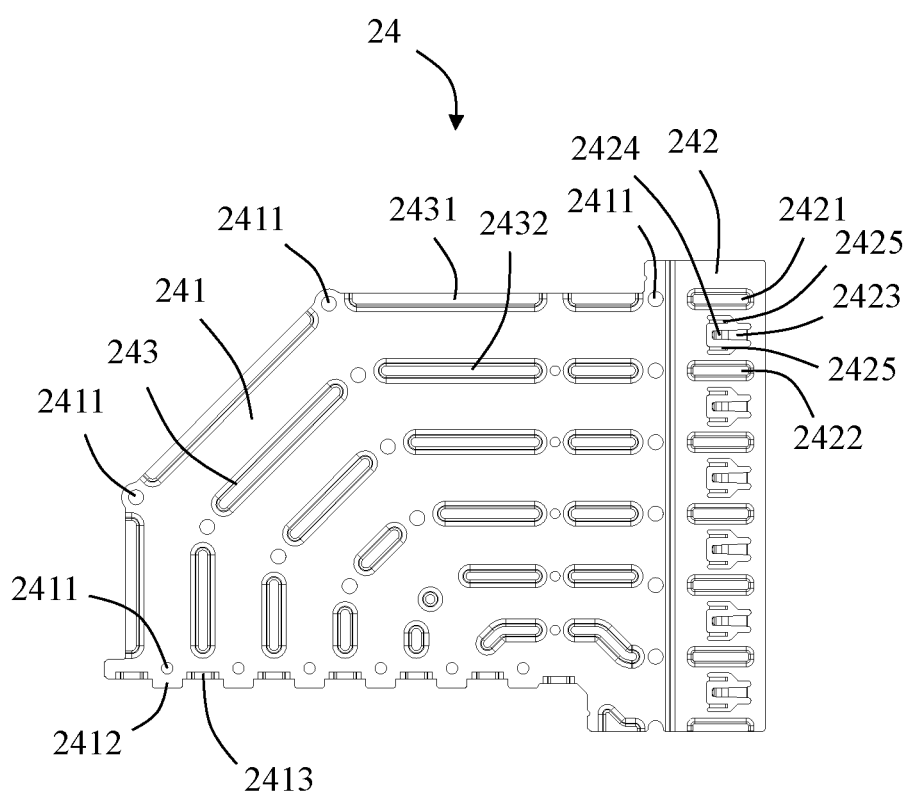
FIG. 20 is a side view of the second metal shield of the first backplane connector.

Similarly, referring to FIGS. 16 and 20, the second metal shield 24 includes a second main body portion 241 and a second extension portion 242 extending from the second main body portion 241. The second main body portion 241 is located on the other side of the first connection portions 223 of the first conductive terminals 22. The second extension portion 242 is located on the other side of the first contact portions 221 of the first conductive terminals 22. In the illustrated embodiment of the present disclosure, the second extension portion 242 and the second main body portion 241 are located in different planes, in which the second extension portion 242 is farther away from the first metal shield 23 than the second main body portion 241. The second main body portion 241 includes a plurality of second mounting holes 2411 for mating with the plurality of second posts 2162. The second posts 2162 are fixed and positioned in the second mounting holes 2411 by soldering, so as to realize the fixing and positioning of the second metal shield 24 and the first insulating frame 21. The second main body 241 includes a plurality of ribs 243. The ribs 243 include a plurality of third ribs 2431 protruding toward the first ground terminals G1 and a plurality of fourth ribs 2432 protruding toward the second ground terminals G2. The third ribs 2431 are disposed along the extending direction of the first connection portion 223 of the first ground terminal G1. The fourth ribs 2432 are disposed along the extending direction of the first connection portion 223 of the second ground terminal G2. In the illustrated embodiment of the present disclosure, the third ribs 2431 and the fourth ribs 2432 are formed by stamping the second main body portion 241. The third ribs 2431 and the fourth ribs 2432 protrude toward the first metal shield 23. The third ribs 2431 and the fourth ribs 2432 are discontinuously disposed along the extending direction of the first connection portion 223 of the first ground terminal G1 and the extending direction of the first connection portion 223 of the second ground terminal G2, respectively, so as to achieve multi-position contact. As a result, the reliability of the contact between the second metal shield 24 and the first ground terminals G1 and the second ground terminals G2 is improved. In the illustrated embodiment of the present disclosure, a wall thickness of the third rib 2431, a wall thickness of the fourth rib 2432 and a wall thickness of a portion of the second main body 241 located between the third rib 2431 and the fourth rib 2432 are the same. In an embodiment of the present disclosure, soldering is performed on the surfaces of the ribs 233 and the ribs 243 to solder the ribs 233 and the ribs 243 to the first ground terminals G1 and the second ground terminals G2. For example, soldering is performed on the surfaces of the first ribs 2331, the second ribs 2332, the third ribs 2431 and the fourth ribs 2432 in order to solder the first ribs 2331, the second ribs 2332, the third ribs 2431 and the fourth rib 2432 to the first ground terminals G1 and the second ground terminals G2. The soldering method is at least one of spot soldering, laser soldering and ultrasonic soldering.

The second extension portion 242 includes a plurality of third bulges 2421 protruding toward the first contact portions 221 of the first ground terminals G1, a plurality of fourth bulges 2422 protruding toward the first contact portions 221 of the second ground terminals G2, and a plurality of second elastic pieces 2423 each of which is located between adjacent third bulge 2421 and fourth bulge 2422. The second elastic pieces 2423 extend along directions toward the second main body portion 241. Each second elastic piece 2423 has an arc-shaped contact portion 2424. In the illustrated embodiment of the present disclosure, the second extension portion 242 further includes two second protruding tabs 2425 located at opposite sides of each second elastic piece 2423. The second protruding tabs 2425 and the second elastic pieces 2423 extend along opposite directions. The second protruding tabs 2425 protrude sidewardly to contact the adjacent first wafer 2 so as to improve the shielding effect. In the illustrated embodiment of the present disclosure, a wall thickness of the third bulge 2421, a wall thickness of the fourth bulge 2422, and a wall thickness of a portion of the second extension portion 242 located between the third bulge 2421 and the fourth bulge 2422 are the same.

In addition, the second main body portion 241 further includes a plurality of second protruding pieces 2412 extending downwardly from a bottom edge thereof, and a plurality of connecting pieces 2413 each of which is located between two adjacent second protruding pieces 2412. By providing the second protruding pieces 2412, the shielding length can be extended, and the shielding effect on the first signal terminals S1 can be improved. In the illustrated embodiment of the present disclosure, the connecting pieces 2413 are stamped from the second main body portion 241, and the connecting piece 2413 straddles the corresponding slot 2231 so as to connect the other side of the first end portion 2232 and the second end portion 2233 of the same first ground terminal G1 so as to improve the shielding effect. At the same time, the connecting piece 2413 can also connect the other side of the first end portion 2232 and the second end portion 2233 of the same second ground terminal G2 so as to improve the shielding effect.

Figure 21:
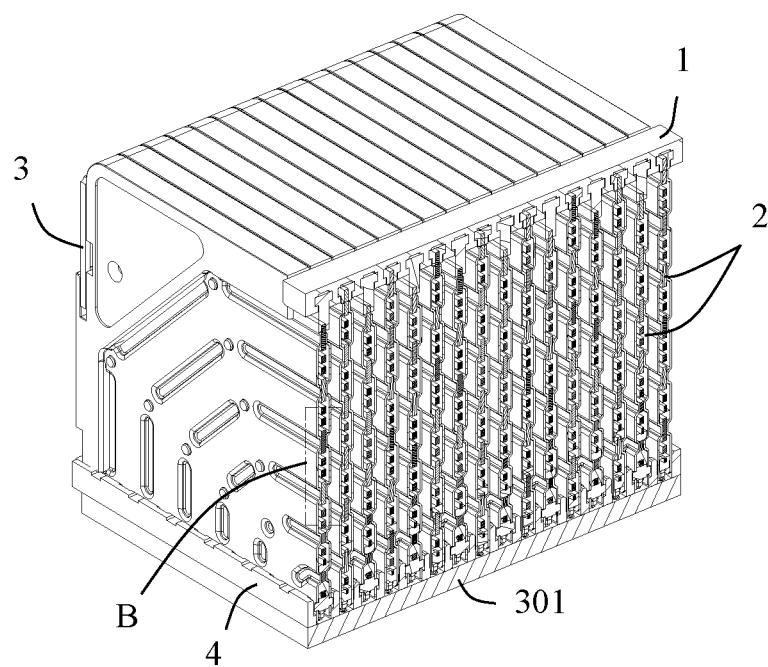
FIG. 21 is a partial perspective cross-sectional view taken along line A'-A' in FIG. 5.
Figure 22:
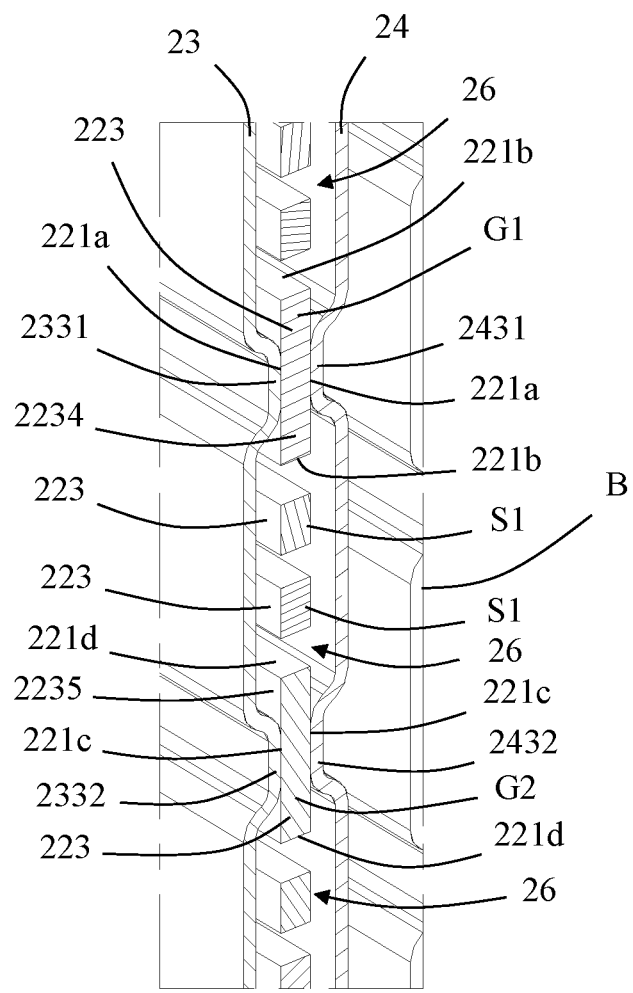
FIG. 22 is a partial enlarged view of a frame part B in FIG. 21.

Referring to FIGS. 21 and 22, along a length of the first connection portion 223 of the first conductive terminal 22, the first rib 2331 of the first metal shield 23 and the third rib 2431 of the second metal shield 24 respectively contact two opposite sides of the first connection portion 223 of the first ground terminal G1, and the second rib 2332 of the first metal shield 23 and the fourth rib 2432 of the second metal shield 24 respectively contact two opposite sides of the first connection portion 223 of the second ground terminal G2, thereby forming a shielding cavity 26 surrounding the periphery of the first connection portions 223 of each pair of first differential signal terminals. In the illustrated embodiment of the present disclosure, the first rib 2331 and the third rib 2431 respectively contact the first wide surface 221a of the first connection portion 223 of the first ground terminal G1. The second rib 2332 and the fourth rib 2432 respectively contact the second wide surface 221c of the first connection portion 223 of the second ground terminal G2. In the illustrated embodiment of the present disclosure, the shielding cavity 26 is jointly formed by the first main body portion 231, the second main body portion 241, the first ground terminal G1 and the second ground terminal G2. The first connection portion 223 of the first ground terminal G1 includes a first tab portion 2234 protruding into the shielding cavity 26. The first connection portion 223 of the second ground terminal G2 includes a second tab portion 2235 protruding into the shielding cavity 26. The first connection portions 223 of the first differential signal terminals are located between the first tab portion 2234 and the second tab portion 2235. In the illustrated embodiment of the present disclosure, there are a plurality of the shielding cavities 26 which are disposed along an arrangement direction of each group of the first conductive terminals 22. Two adjacent shielding cavities 26 share a single first ground terminal G1 or a single second ground terminal G2. In addition, a part of the shared first ground terminal G1 protrudes into one shielding cavity 26, and another part of the shared first ground terminal G1 protrudes into another shielding cavity 26.

Referring to FIG. 26, in the length of the first contact portion 221 of the first conductive terminal 22, the first bulge 2321 of the first metal shield 23 and the third bulge 2421 of the second metal shield 24 respectively contact two opposite side surfaces of the first contact portion 221 of the first ground terminal G1, and the second bulge 2322 of the first metal shield 23 and the fourth bulge 2422 of the second metal shield 24 respectively contact two opposite side surfaces of the first contact portion 221 of the second ground terminal G2. In the illustrated embodiment of the present disclosure, the first bulge 2321 of the first metal shield 23 and the third bulge 2421 of the second metal shield 24 respectively contact the first narrow surfaces 221b of the first contact portion 221 of the first ground terminal G1. The second bulge 2322 of the first metal shield 23 and the fourth bulge 2422 of the second metal shield 24 respectively contact the second narrow surfaces 221d of the first contact portion 221 of the second ground terminal G2. The first extension portion 232, the second extension portion 242, the first ground terminal G1 and the second ground terminal G2 jointly form a shielding space 27 for accommodating the corresponding first contact portions 221 of the first differential signal terminals. The first elastic piece 2323 and the second elastic piece 2423 extend into the shielding space 27. In the illustrated embodiment of the present disclosure, there are multiple shielding spaces 27 which are disposed along a stacking direction of each group of the first conductive terminals 22. Two adjacent shielding spaces 27 share a single first ground terminal G1 or a single second ground terminal G2. One first wide surface 221a of the first contact portion 221 of the shared first ground terminal G1 is exposed to the shielding space 27, and the other first wide surface 221a of the first contact portion 221 of the shared first ground terminal G1 is exposed to an adjacent shielding space 27. Similarly, a first wide surface 221c of the first contact portion 221 of the shared second ground terminal G2 is exposed to the adjacent shielding space 27, and the other wide surface 221c of the first contact portion 221 of the shared second ground terminal G2 is exposed to another adjacent shielding space 27.

Figure 23:
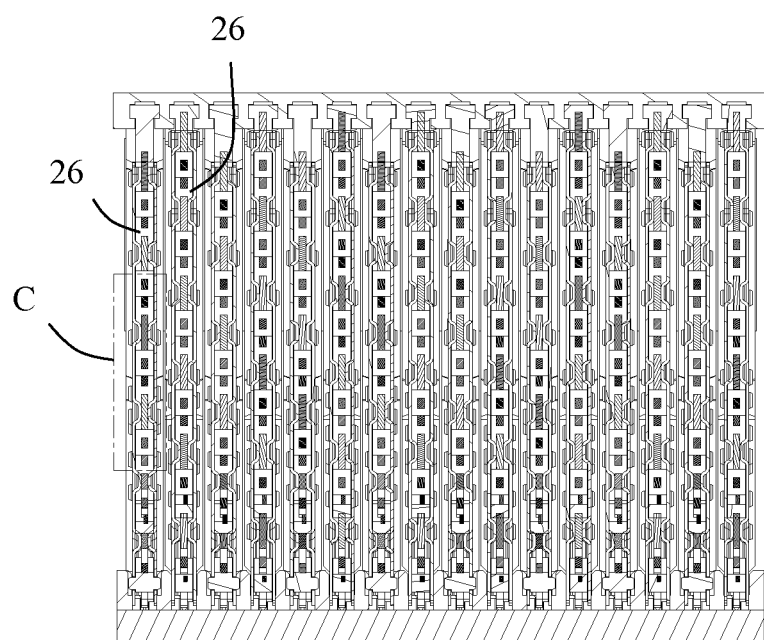
FIG. 23 is a schematic cross-sectional view taken along the line A'-A' in FIG. 5.
Figure 25:
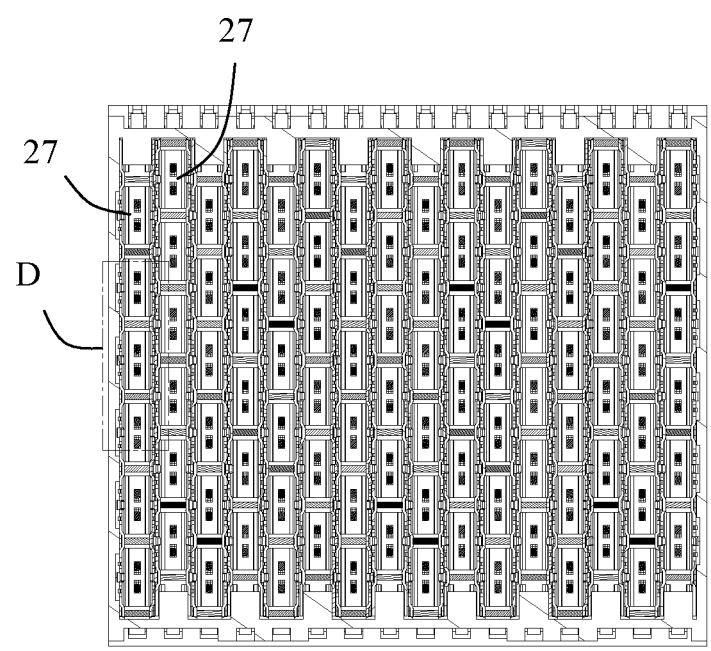
FIG. 25 is a schematic cross-sectional view taken along line B'-B' in FIG. 5.

In the illustrated embodiment of the present disclosure, there are multiple first wafers 2 of the first backplane connector 100, and the terminal arrangement of two adjacent first wafers 2 are staggered. Correspondingly, the shielding cavities 26 at the same position of two adjacent first wafers 2 are staggered (referring to FIG. 23), and the shielding spaces 27 at the same position of two adjacent first wafers 2 are staggered (referring to FIG. 25).

Figure 9:
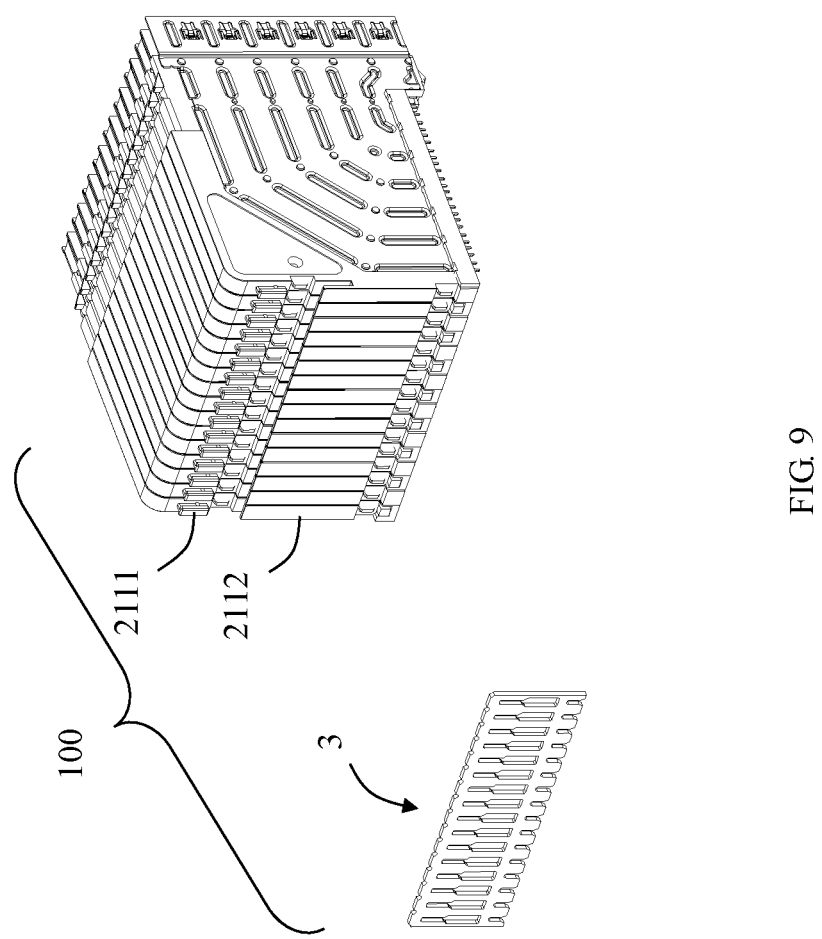
FIG. 9 is a partial perspective exploded view of the first backplane connector of the present disclosure, in which the first spacer is separated.
Figure 10:
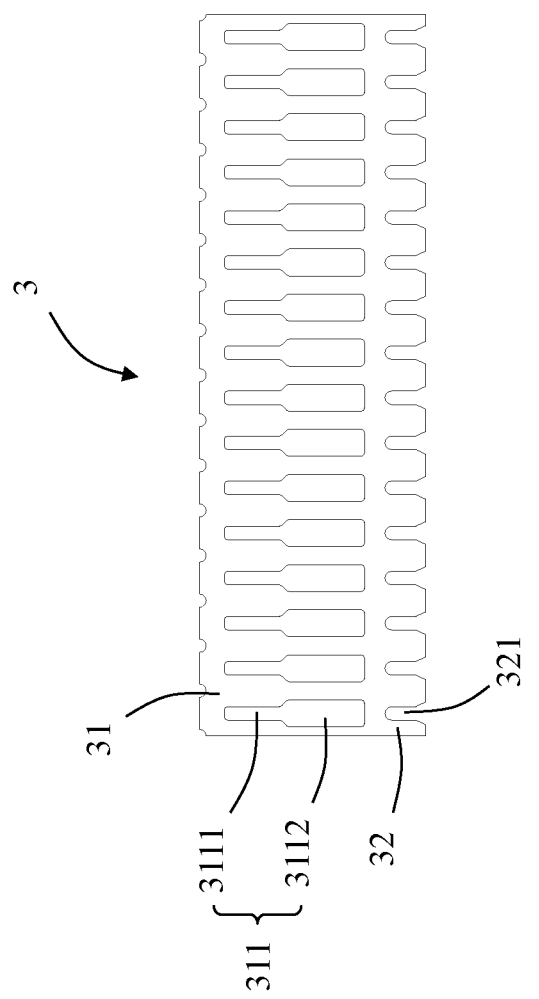
FIG. 10 is a top view of the first spacer in FIG. 9.
Figure 11:
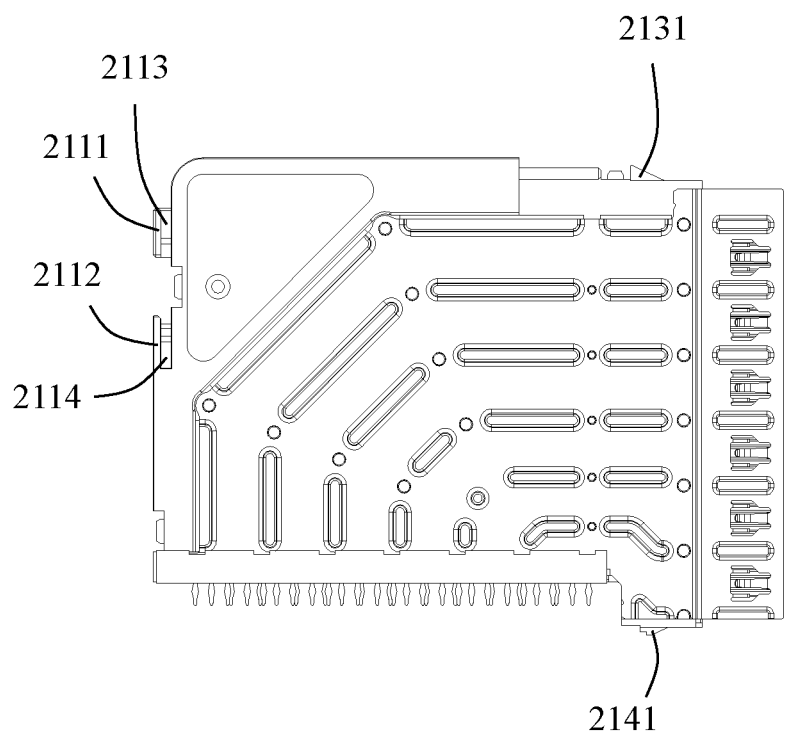
FIG. 11 is a front view of the first backplane connector of the present disclosure after the first spacer in FIG. 9 is removed.

Referring to FIGS. 9 to 11, in the illustrated embodiment of the present disclosure, the first spacer 3 is made of metal material or insulating material. The first spacer 3 includes a body portion 31 and a protruding piece 32 extending from the body portion 31. The body portion 31 includes a plurality of slots 311 corresponding to the first protrusions 2111. The protruding piece 32 includes a plurality of slits 321 corresponding to the second protrusions 2112, so that the protruding piece 32 is roughly comb-shaped. Each slot 311 is a closed slot, which means the circumference of the slot 311 is surrounded by the body portion 31. Each slit 321 is a non-closed slit, which means one end of the slit 321 is opened. The slit 321 is in alignment with the corresponding slot 321 along the vertical direction. Each slot 311 includes a first slot 3111 and a second slot 3112 which has a width larger than that of the first slot 3111. The first slot 3111 is located above the second slot 3112 and communicates with the corresponding second slot 3112. The slit 321 is located below the corresponding second slot 3112.

When assembling the first spacer 3 to the plurality of first wafers 2, firstly, the second slots 3112 of the first spacer 3 are corresponding to the first protrusions 2111 along the extending direction of the first contact portions 221, and make the first protrusions 2111 pass through the second slots 3112. Then, the first spacer 3 is moved downwardly along the extending direction of the first tail portions 222, so that the first constriction portions 2113 are tightly clamped in the corresponding first slots 3111, thereby the first wafers 2 can be combined as a whole. This can prevent looseness and prevent the first wafers 2 from being separated from the first spacer 3 along the extending direction of the first contact portions 221. At the same time, the second constriction portions 2114 of the second protrusions 2112 are tightly clamped in the slits 321 so to achieve double fixation and improve reliability.

Figure 12:
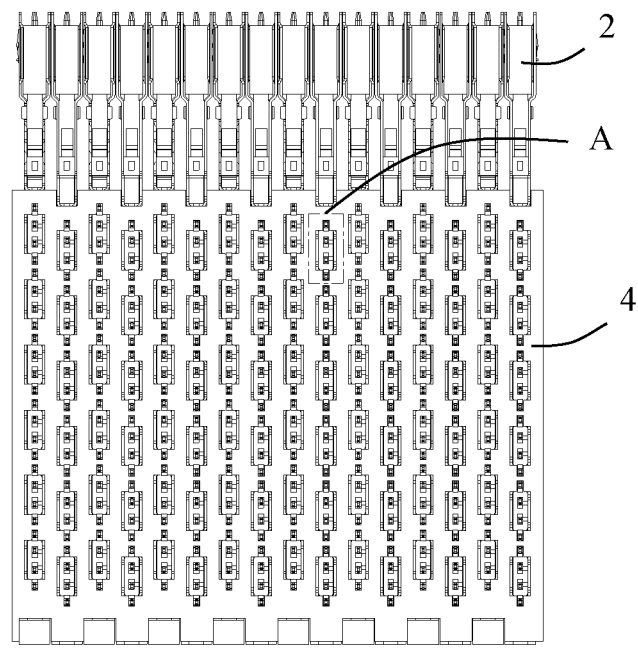
FIG. 12 is a bottom view of FIG. 11.
Figure 13:
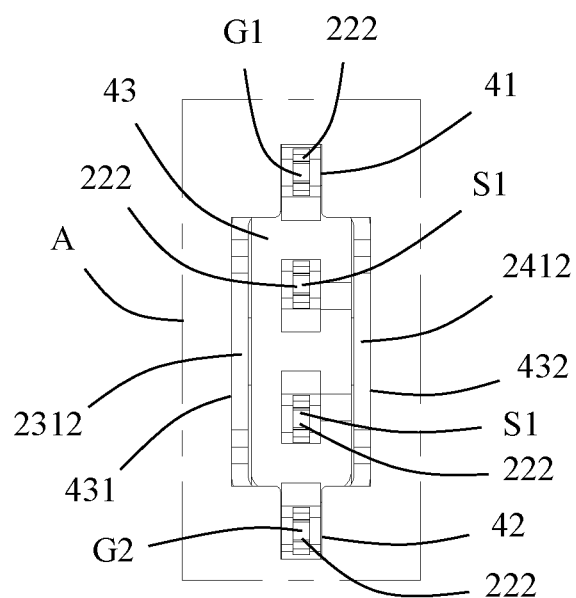
FIG. 13 is a partial enlarged view of a frame part A in FIG. 12.

Referring to FIGS. 12 and 13, the first mounting block 4 includes a plurality of first through holes 41 for allowing the first tail portions 222 of the first ground terminals G1 to pass through, a plurality of second through holes 42 for allowing the first tail portions 222 of the second ground terminals G2 to pass through, and a plurality of slots 43 for allowing the first tail portions 222 of the first signal terminals S1 to pass through. For a group of first conductive terminals 22 arranged in the manner of G1-S1-S1-G2, the first through holes 41 and the second through holes 42 are located on opposite sides of the slot 43 and are in communication with the slot 43. A width of the slot 43 is greater than either a width of the first through hole 41 or a width of the second through hole 42, so that the first tail portions 222 of the first differential signal terminals can be completely exposed in the slot 43. The first mounting block 4 further includes a first abutting surface 431 located on one side of the slot 43 and a second abutting surface 432 located on the other side of the slot 43. The first abutting surface 431 and the second abutting surface 432 are disposed opposite to each other. Both the first protruding pieces 2312 of the first metal shield 23 and the second protruding pieces 2412 of the second metal shield 24 are at least partially inserted into the slots 43. In the illustrated embodiment of the present disclosure, the first protruding piece 2312 of the first metal shield 23 abuts against the first abutting surface 431. The second protruding piece 2412 of the second metal shield 24 abuts against the second abutting surface 432. Along an arrangement direction of a group of first conductive terminals 22 which are arranged in the manner of G1-S1-S1-G2, the first tail portions 222 of the first differential signal terminals are located between the first tail portion 222 of the first ground terminal G1 and the first tail portion 222 of the second ground terminal G2. Along a direction perpendicular to the arrangement direction, the first tail portions 222 of the first differential signal terminals are located between the first protruding piece 2312 of the first metal shield 23 and the second protruding piece 2412 of the second metal shield 24. This arrangement improves the shielding effect of the first differential signal terminals. Preferably, the first mounting block 4 is electroplated plastic which can further improve the shielding effect.

Figure 14:
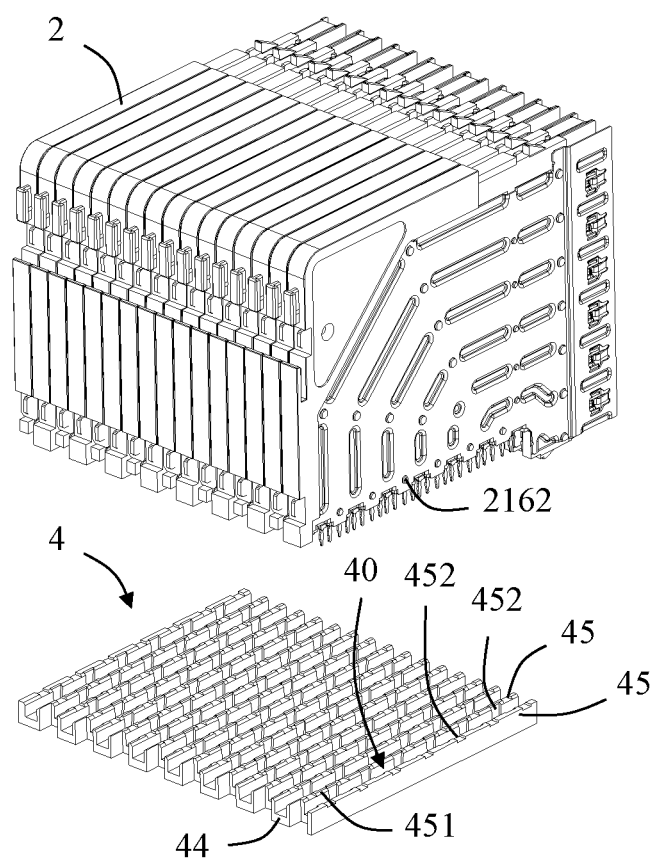
FIG. 14 is a partial perspective exploded view of the first backplane connector of the present disclosure, in which a first mounting block is separated.

Referring to FIG. 14, the first mounting block 4 further includes a first mounting wall 44 and a plurality of first side walls 45 perpendicular to the first mounting wall 44. The plurality of first side walls 45 are spaced apart and parallel to each other. A plurality of first slots 40 for insertion of the first wafers 2 are formed between each two adjacent first side walls 45. A top of the first side wall 45 includes a first inclined surface 451 communicating with the first slot 40 and acting as an insertion guide. The first inclined surfaces 451 of the two first side walls 45 located on opposite sides of the first slot 40 have different inclination directions so as to form a bell-mouth opening. The bell-mouth opening is adapted to facilitate the insertion of the first wafers 2 or to facilitate to mount the first mounting block 4 to the first wafers 2. An inner side of the first side wall 45 also includes a plurality of first positioning grooves 452 communicating with the first slot 40 and used for positioning the first post 2161 and the second post 2162 which are located on the first bottom wall 214 of the first insulating frame 21.

Figure 3:
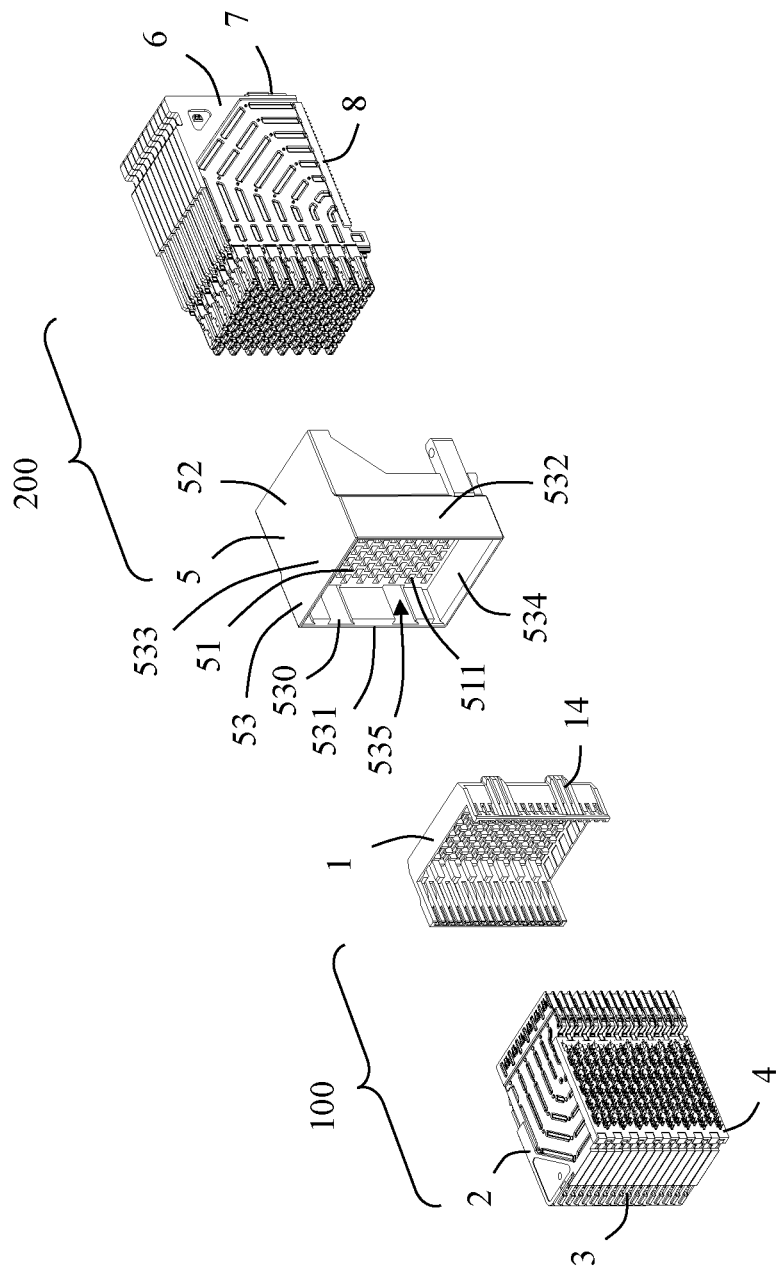
FIG. 3 is a further perspective exploded view of FIG. 2.
Figure 4:
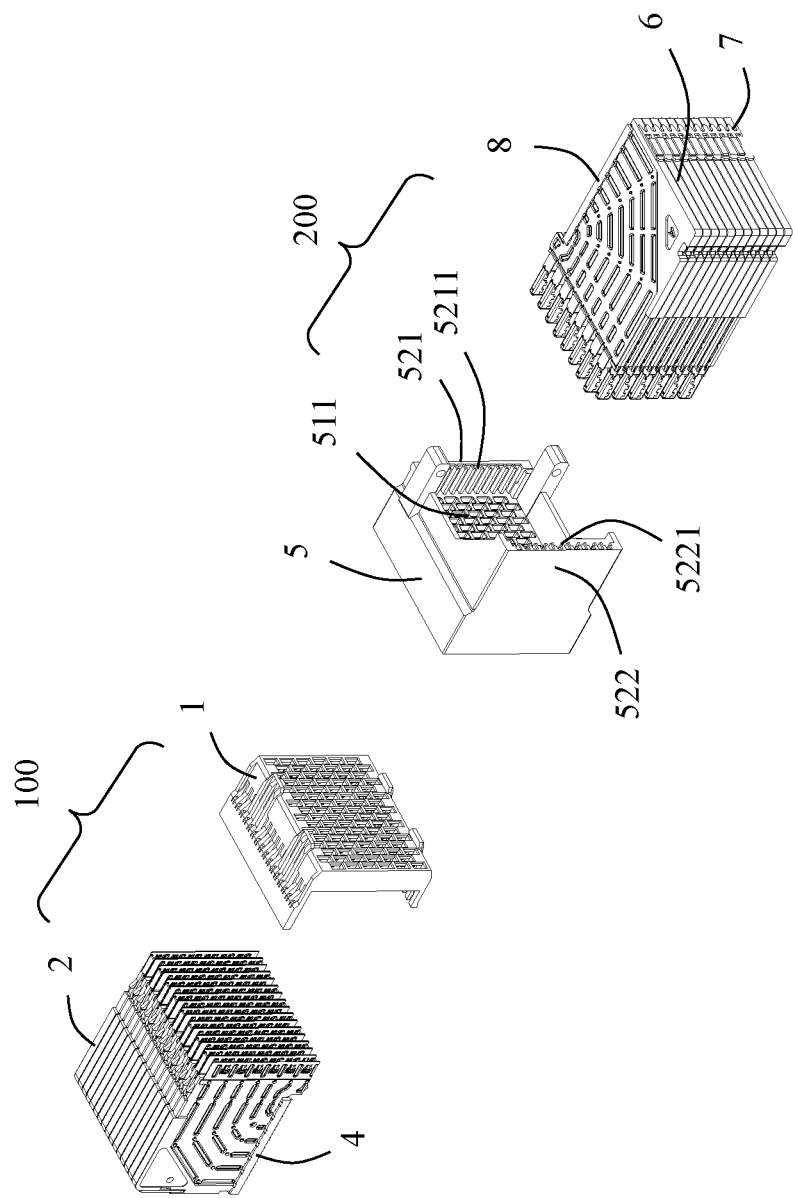
FIG. 4 is a perspective exploded view of FIG. 3 from another angle.
Figure 5:
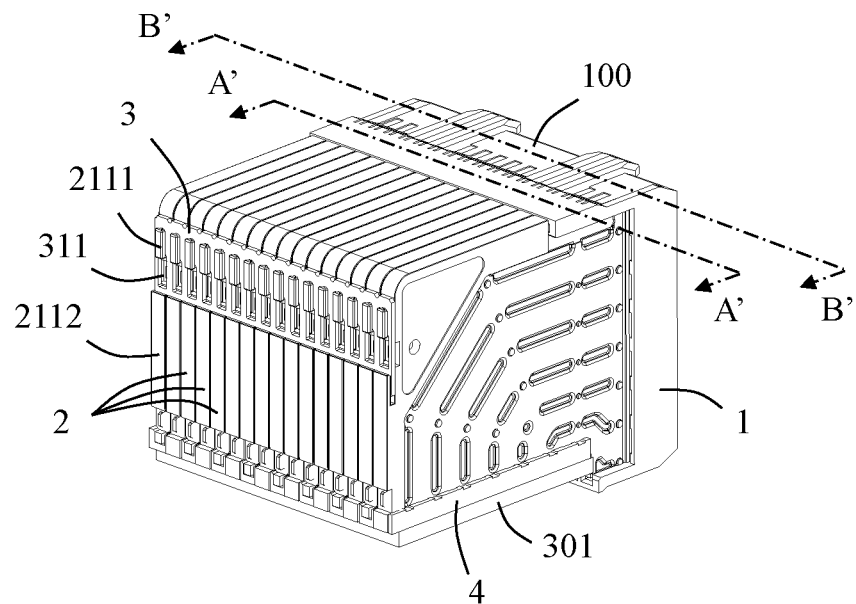
FIG. 5 is a perspective schematic view of a first backplane connector of the present disclosure when it is mounted to a first circuit board.
Figure 6:
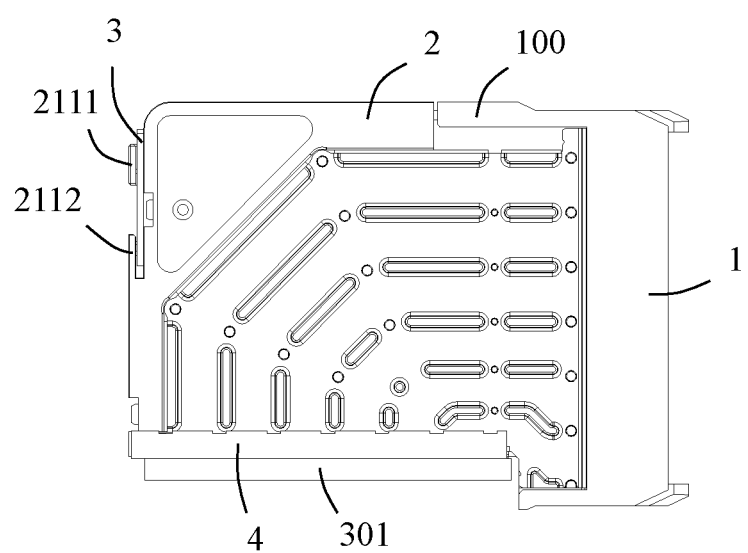
FIG. 6 is a side view of FIG. 5.

Referring to FIGS. 3 and 4, the second backplane connector 200 includes a second header 5, a plurality of second wafers 6 assembled to the second header 5, a second spacer 7 holding on one side of the plurality of second wafers 6, and a second mounting block 8 holding the other side of the plurality of second wafers 6.

The second header 5 is made of insulating material. The second header 5 includes a second body portion 51, a wall portion 52 extending from the second body portion 51 to one end, and a frame portion 53 extending from the second body portion 51 to the other end. The second body portion 51 includes a plurality of second terminal receiving grooves 511 extending forwardly and rearwardly. In the illustrated embodiment of the present disclosure, the second terminal receiving grooves 511 are disposed in multiple rows along a left-right direction. Two adjacent rows of second terminal receiving grooves 511 are staggered in a vertical direction. That is, in two adjacent rows of the second terminal receiving grooves 511, the second terminal receiving grooves 511 at corresponding positions are not in alignment with each other in the left-right direction. The wall portion 52 includes a first wall portion 521 and a second wall portion 522 disposed opposite to each other. The first wall portion 521 includes a plurality of first slots 5211. The second wall portion 522 includes a plurality of second slots 5221. The first slot 5211 and the second slot 5221, which are in alignment with each other along the vertical direction, together with the second terminal receiving slot 511 corresponding to the first slot 5211 and the second slot 5221 are jointly used for receiving the same second wafer 6.

The frame portion 53 includes a first extension wall 531, a second extension wall 532 opposite to the first extension wall 531, a top wall 533 connecting one end of the first extension wall 531 and one end of the second extension wall 532, a bottom wall 534 connecting the other end of the first extension wall 531 and the other end of the second extension wall 532, and a receiving space 535 jointly enclosed by the first extension wall 531, the second extension wall 532, the top wall 533 and the bottom wall 534. The receiving space 535 is used for at least partially accommodating the first backplane connector 100. Specifically, in the illustrated embodiment of the present disclosure, both the first extension wall 531 and the second extension wall 532 include a plurality of positioning grooves 530 disposed at intervals. The receiving space 535 is used for accommodating the first header 1. The positioning grooves 530 are used for accommodating the corresponding positioning protrusions 14 so as to improve the mating accuracy of the first backplane connector 100 and the second backplane connector 200.

Figure 35:
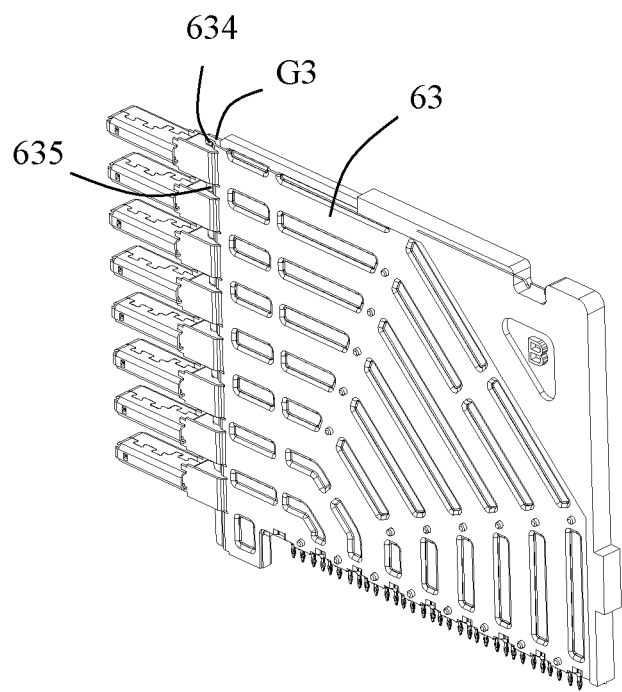
FIG. 35 is a perspective schematic view of a second wafer of the second backplane connector.
Figure 36:
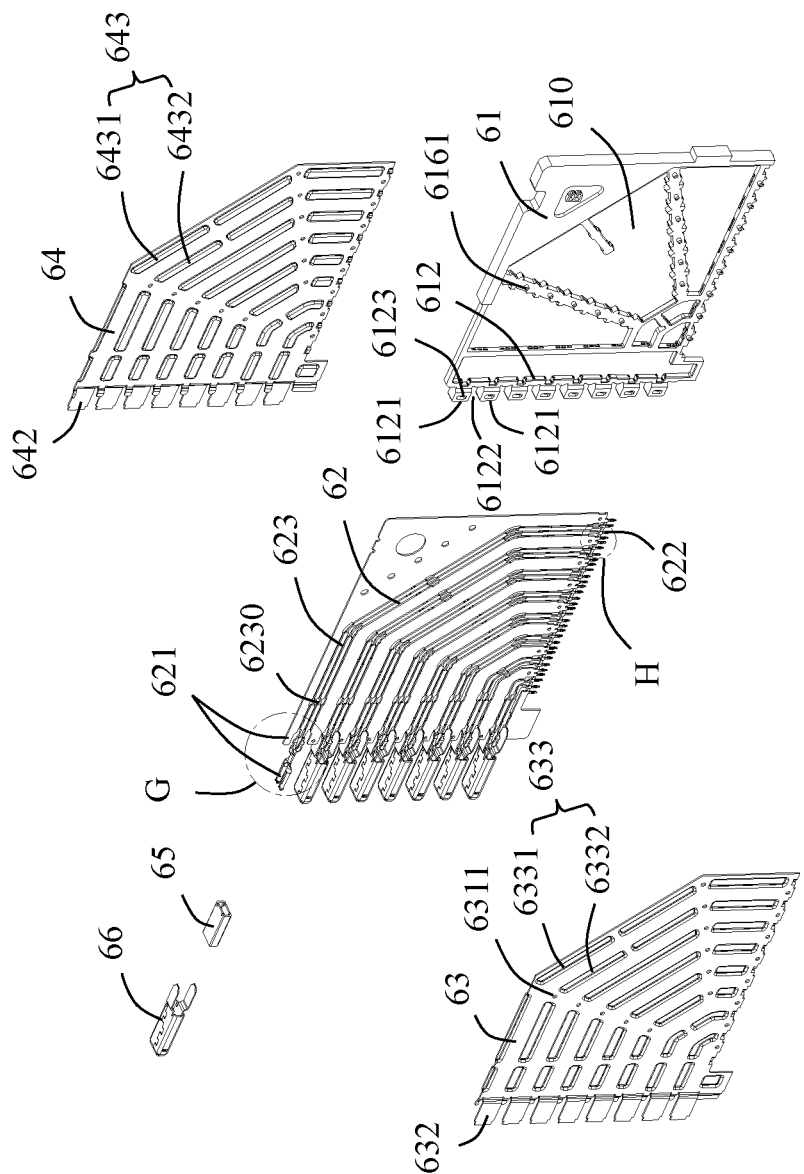
FIG. 36 is a partially exploded perspective view of FIG. 35.

Referring to FIGS. 35 and 36, each second wafer 6 includes a second insulating frame 61, a plurality of second conductive terminals 62 insert-molded with the second insulating frame 61, a third metal shield 63 fixed on one side of the second insulating frame 61, and a fourth metal shield 64 fixed on the other side of the second insulating frame 61.

Figure 43:
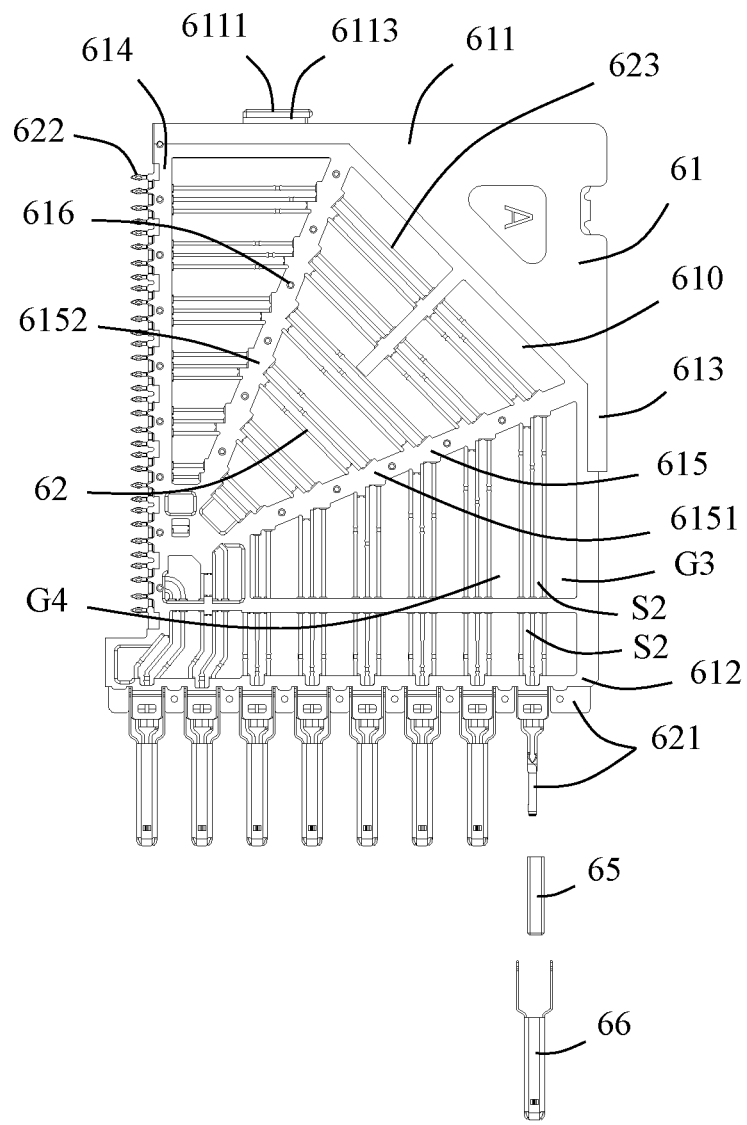
FIG. 43 is a plan view after removing the third metal shield and the fourth metal shield in FIG. 40.

Referring to FIG. 43, the second insulating frame 61 is roughly frame-shaped. The second insulating frame 61 includes a second rear wall 611, a second front wall 612 opposite to the second rear wall 611, a second top wall 613 connecting one end of the second rear wall 611 and one end of the second front wall 612, a second bottom wall 614 connecting the other end of the second rear wall 611 and the other end of the second front wall 612, and a plurality of connecting walls 615. The connecting walls 615 can enhance the structural strength of the frame. The second rear wall 611 includes a first protrusion 6111. The first protrusion 6111 includes a first constriction portion 6113. In the illustrated embodiment of the present disclosure, the second insulating frame 61 includes a second hollow portion 610. The connecting walls 615 include a third connecting wall 6151 connecting the second top wall 613 and the second bottom wall 614, and a fourth connecting wall 6152 connecting the second rear wall 611 and the second bottom wall 614. The third connecting wall 6151 and the fourth connecting wall 6152 are exposed in the second hollow portion 610.

Referring to FIG. 36, the second front wall 612 includes a plurality of protruding blocks 6121 disposed at intervals and a groove 6122 located between two adjacent protruding blocks 6121. The protruding block 6121 includes an opening 6123 to partially expose corresponding second conductive terminal 62 in order to adjust the impedance.

The second insulating frame 61 further includes a plurality of posts 616 for fixing and positioning the third metal shield 63 and the fourth metal shield 64. In the illustrated embodiment of the present disclosure, the posts 616 are disposed on the second bottom wall 614, the third connecting wall 6151 and the fourth connecting wall 6152. The third metal shield 63 and the fourth metal shield 64 are located on two sides of the second insulating frame 61, respectively. The posts 616 include a plurality of third posts 6161 and a plurality of fourth posts 6162. The third posts 6161 and the fourth posts 6162 are located on opposite sides of the second insulating frame 61 so to be fixed to the third metal shield 63 and the fourth metal shield 64, respectively.

Each second conductive terminals 62 includes a second contact portion 621, second tail portion 622, and a second connection portion 623 connecting the second contact portion 621 and the second tail portion 622. Some of the second contact portions 621 are used to electrically connect with the first backplane connector 100. The second tail portions 622 are used to be mounted to the second circuit board 302. In the illustrated embodiment of the present disclosure, the second contact portion 621 is substantially perpendicular to the second tail portion 622. The second connection portion 623 is of a curved configuration.

Each group of second conductive terminals 62 include a plurality of third ground terminals G3, a plurality of fourth ground terminals G4, and a plurality of second signal terminals S2. In the illustrated embodiment of the present disclosure, two adjacent second signal terminals S2 form a pair of second differential signal terminals. Each pair of second differential signal terminals are located between one third ground terminal G3 and one fourth ground terminal G4. That is, each group of second conductive terminals 62 are disposed in a manner of G3-S2-S2-G4, which is beneficial to improve the quality of signal transmission. The second differential signal terminals are narrow-side coupling or wide-side coupling. A width of the third ground terminal G3 and a width of the fourth ground terminal G4 are greater than a width of each second signal terminal S2 therebetween, which is beneficial to increase the shielding area and improve the shielding effect.

Figure 38:
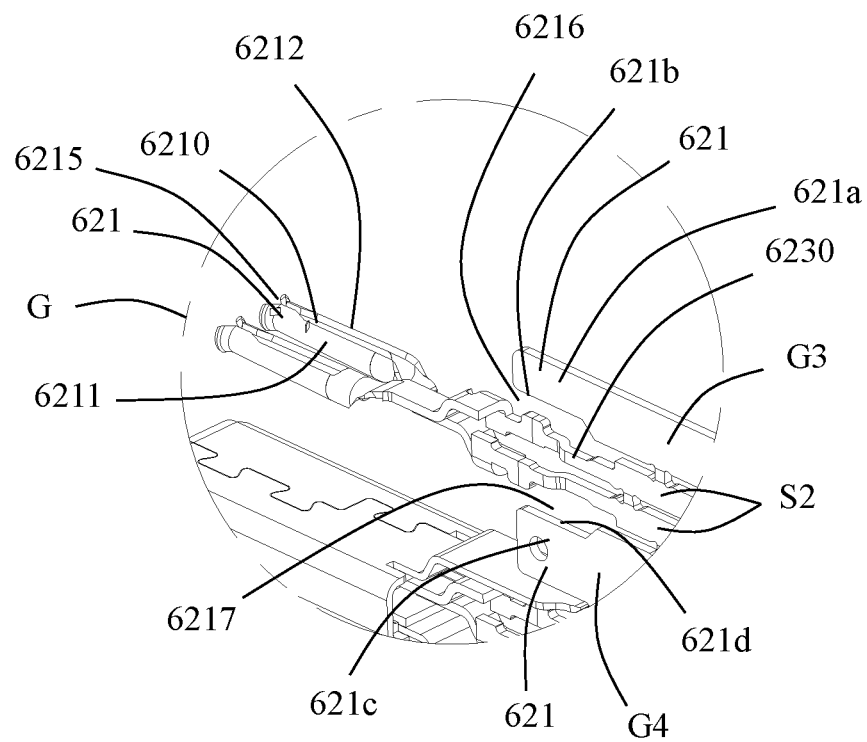
FIG. 38 is a partial enlarged view of a circled part G in FIG. 36.

In the illustrated embodiment of the present disclosure, the second connection portions 623 of the second conductive terminals 62 are partially insert-molded with the second insulating frame 61. The second connection portion 623 of the second signal terminal S2 includes a narrowed portion 6230 insert-molded with the second insulating frame 61 for adjusting the impedance of the second signal terminal S2 in order to achieve impedance matching. Referring to FIG. 38, in the illustrated embodiment of the present disclosure, each second contact portion 621 of the second signal terminal S2 has a two-half structure, which includes a first contact section 6211, a second contact section 6212, and a slot 6210 located between the first contact section 6211 and the second contact section 6212. When the needle-shaped first contact portion 221 of the first signal terminal S1 of the first backplane connector 100 is inserted between the first contact section 6211 and the second contact section 6212, the first contact section 6211 and the second contact section 6212 can be elastically deformed in order to improve the contact reliability. The first contact section 6211 includes a first arc-shaped surface, and the second contact section 6212 includes a second arc-shaped surface. The first arc-shaped surface and the second arc-shaped surface are disposed opposite to each other so as to jointly form a mating hole 6215 for receiving the first contact portion 221 of the first signal terminal S1 of the first backplane connector 100. The two second signal terminals S2 constituting a pair of second differential signal terminals, their second connection portions 623 are disposed in a first direction (for example, a vertical direction), and their second contact portions 621 are disposed in a direction (for example, a left-right direction) perpendicular to the first direction.

Figure 39:
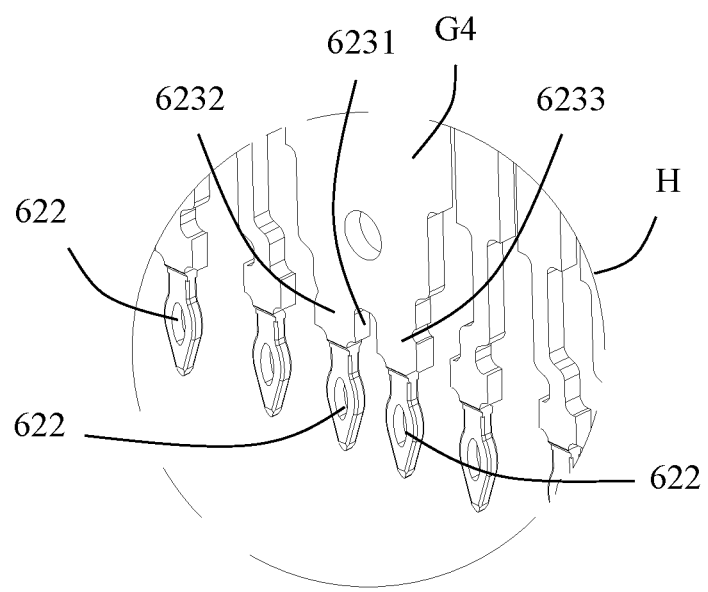
FIG. 39 is a partial enlarged view of a circled part H in FIG. 36.

Each second contact portion 621 of the third ground terminal G3 and the fourth ground terminal G4 is substantially flat. The second contact portion 621 of the third ground terminal G3, the second contact portion 621 of the fourth ground terminal G4, and the second connection portions 623 of the second conductive terminals 62 are all coplanar. As shown in FIG. 39, each second connection portion 623 of the third ground terminal G3 and the fourth ground terminal G4 further includes a slot 6231 adjacent to its corresponding the second tail portion 622. The slot 6231 extends through a bottom edge of the second connection portion 623, so that the second connection portion 623 is divided into a first end portion 6232 and a second end portion 6233. Each of the first end portion 6232 and the second end portion 6233 is connected with one second tail portion 622. The second contact portion 621 of the third ground terminal G3 and the second contact portion 621 of the fourth ground terminal G4 both extend into the corresponding grooves 6122 to facilitate contact with the third metal shield 63 and the fourth metal shield 64. The second contact portions 621 of the second signal terminals S2 extend beyond the protruding block 6121.

In the illustrated embodiment of the present disclosure, the second contact portion 621 and the second connection portion 623 of the third ground terminal G3 both include a first wide surface 621a and a first narrow surface 621b perpendicular to the first wide surface 621a. The second contact portion 621 and the second connection portion 623 of the fourth ground terminal G4 both include a second wide surface 621c and a second narrow surface 621d perpendicular to the second wide surface 621c. The second connection portions 623 of each pair of second differential signal terminals are located between the first narrow surface 621b of the third ground terminal G3 and the second narrow surface 621d of the fourth ground terminal G4 which are located on opposite sides of the second connection portions 623 of each pair of second differential signal terminals.

Figure 34:
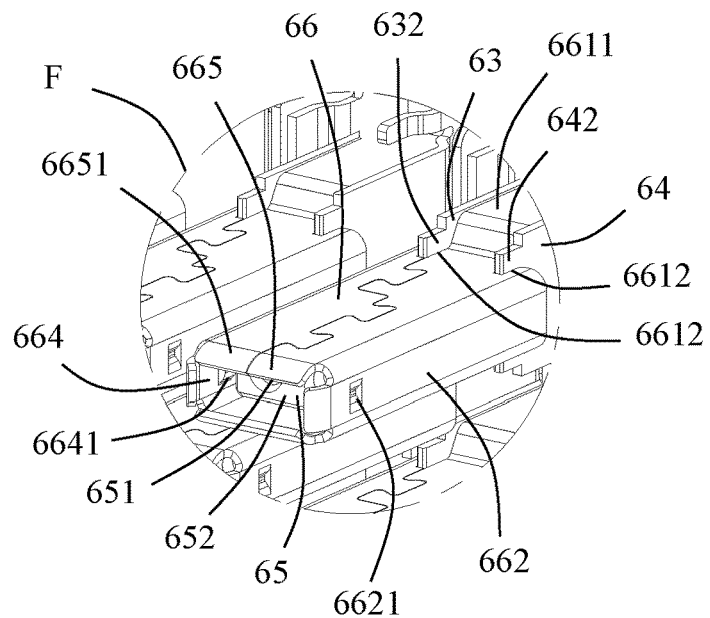
FIG. 34 is a partial enlarged view of a circled part F in FIG. 33.
Figure 37:
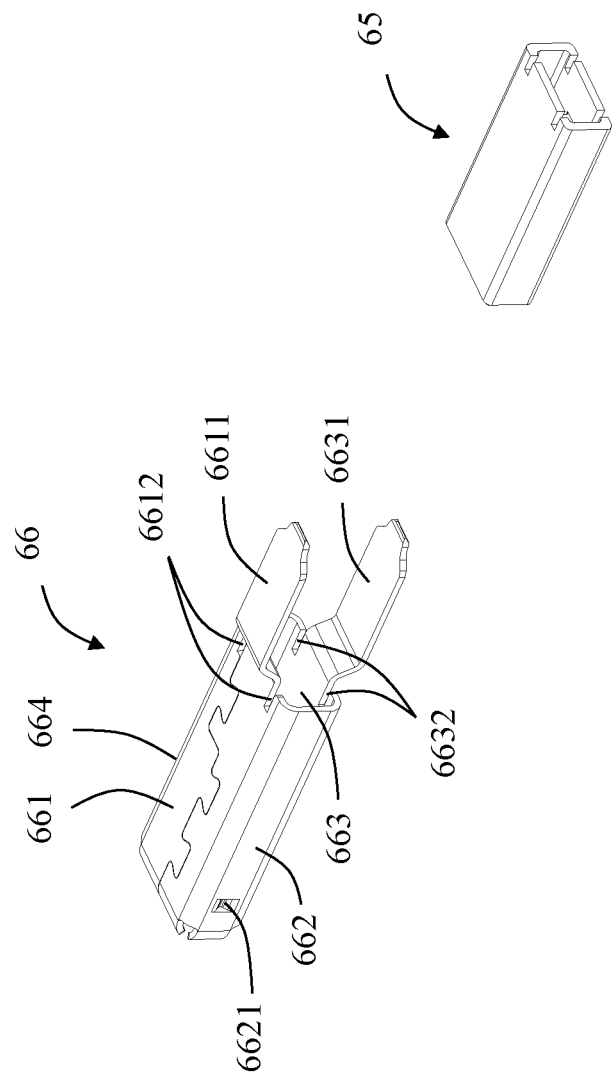
FIG. 37 is a perspective exploded view of an insulating block and a metal shell.
Figure 40:
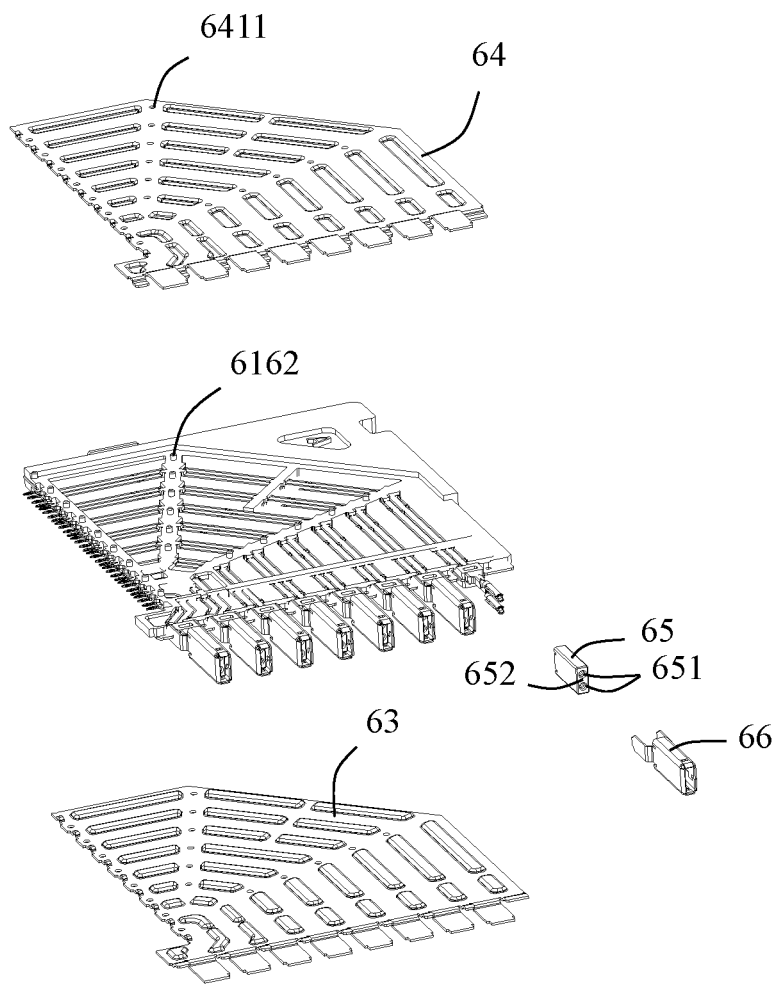
FIG. 40 is a partially exploded perspective view of FIG. 36 from another angle.

Referring to FIGS. 34, 37, and 40, each group of second wafers 6 further includes an insulating block 65 sleeved on the second contact portions 621, and a metal shell 66 sleeved on the insulating block 65. Each insulating block 65 includes two through holes 651 into which the second contact portions 621 of the second signal terminals S2 are inserted, and a mating surface 652 at an end thereof. In the illustrated embodiment of the present disclosure, the insulating block 65 is substantially cuboid shaped. Correspondingly, the metal shell 66 is substantially cuboid shaped. In an embodiment of the present disclosure, the insulating block 65 is fixed in the metal shell 66, for example, by assembling.

Referring to FIGS. 34 and 37, the metal shell 66 includes a first side wall 661, a second side wall 662, a third side wall 663 and a fourth side wall 664. The first side wall 661 is opposite to the third side wall 663. The second side wall 662 is opposite to the fourth side wall 664. An area of the first side wall 661 and the third side wall 663 is larger than an area of the second side wall 662 and the fourth side wall 664. The ends of the first side wall 661, the second side wall 662, the third side wall 663 and the fourth side wall 664 all include a deflection portion 665 which is bent inwardly. By providing the deflection portions 665, a constricted portion can be formed at an end of the metal shell 66, so that outer surfaces 6651 of the deflection portions 665 can guide the second wafer 6 to be assembled to the second header 5, and even guide the metal shell 66 to be inserted into the shielding space 27 of the first backplane connector 100. In addition, in order to better restrict the insulating block 65, the second side wall 662 and the fourth side wall 664 further include restriction protrusions 6621, 6641 formed by stamping the second side wall 662 and the fourth side wall 664 inwardly. The restriction protrusions 6621, 6641 are used to mate with the insulating block 65 so as to prevent the insulating block 65 from being drawn out of the metal shell 66.

In the illustrated embodiment of the present disclosure, the metal shell 66 further includes a first extension piece 6611 extending from the first side wall 661 and a pair of first slots 6612 located on opposite sides of the first extension piece 6611. The metal shell 66 further includes a second extension piece 6631 extending from the third side wall 663 and a pair of second slots 6632 located on opposite sides of the second extension piece 6631. The first extension piece 6611 is in vertical contact with the second contact portion 621 of the third ground terminal G3 so as to improve the shielding effect. The second extension piece 6631 is in vertical contact with the second contact portion 621 of the fourth ground terminal G4 so as to improve the shielding effect. In the illustrated embodiment of the present disclosure, the first extension piece 6611 and the second extension piece 6631 are deflected outwardly and then extend, so that a distance between the first extension piece 6611 and the second extension piece 6631 on the same metal shell 66 is greater than a distance between the first side wall 661 and the third side wall 663. Referring to FIGS. 37 and 38, for a group of second conductive terminals 62 arranged in the manner of G3-S2-S2-G4, the second contact portion 621 of the third ground terminal G3 includes a first notch 6216 adjacent to the second differential signal terminals. The first notch 6216 is used for receiving the first extension piece 6611. The second contact portion 621 of the fourth ground terminal G4 includes a second notch 6217 adjacent to the second differential signal terminals. The second notch 6217 is used for receiving the second extension piece 6631. In the illustrated embodiment of the present disclosure, taking two adjacent pairs of second differential signal terminals sharing one fourth ground terminal G4 as an example, two sides of the fourth ground terminal G4 respectively include second notches 6217 facing different second differential signal terminals, and the second notches 6217 are used for mating with two adjacent metal shells 66.

Figure 41:
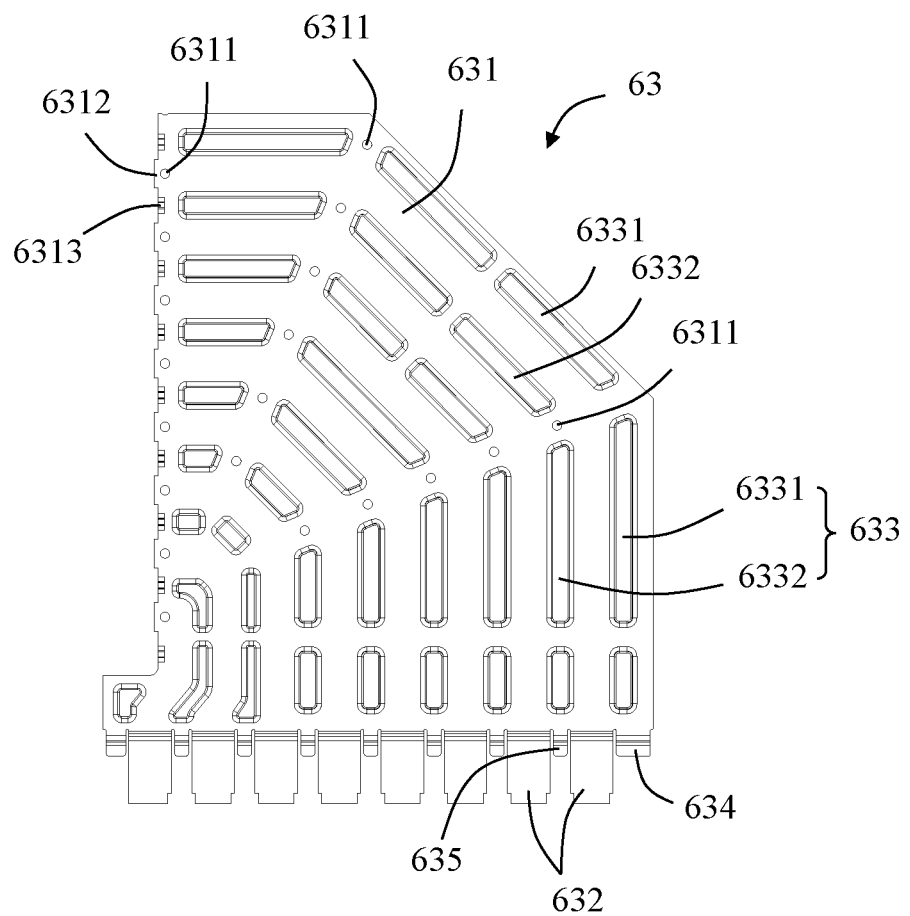
FIG. 41 is a side view of a third metal shield of the second backplane connector.

In the illustrated embodiment of the present disclosure, the third metal shield 63 and the fourth metal shield 64 are symmetrically disposed on both sides of the second insulating frame 61. Referring to FIGS. 36 and 41, the third metal shield 63 includes a third main body portion 631, a third extension portion 632 extending from the third main body portion 631, and a first elastic arm 634 and a second elastic arm 635 which are respectively located on two sides of the third extension portion 632. The first elastic arm 634 and the second elastic arm 635 extend beyond the third main body portion 631 to contact the third ground terminal G3 and the fourth ground terminal G4, respectively. The third main body portion 631 is located on one side of the second connection portion 623 of the second conductive terminal 62. In the illustrated embodiment of the present disclosure, the third extension portion 632 and the third main body portion 631 are located in different planes, in which the third extension portion 632 is farther away from the fourth metal shield 64 than the third main body portion 631. The third main body portion 631 includes a plurality of third mounting holes 6311 for mating with the plurality of third posts 6161. The third posts 6161 are fixed to the third mounting holes 6311 by soldering. The third main body portion 631 includes a plurality of ribs 633. The ribs 633 include a plurality of fifth ribs 6331 protruding toward the third ground terminal G3 and a plurality of sixth ribs 6332 protruding toward the fourth ground terminal G4. The fifth ribs 6331 are disposed along an extending direction of the second connection portion 623 of the third ground terminal G3. The sixth ribs 6332 are disposed along an extending direction of the second connection portion 623 of the fourth ground terminal G4. In the illustrated embodiment of the present disclosure, the fifth ribs 6331 and the sixth ribs 6332 are formed by stamping the third main body portion 631. The fifth ribs 6331 and the sixth ribs 6332 protrude toward the fourth metal shield 64. The fifth ribs 6331 and the sixth ribs 6332 are disposed discontinuously along the extending direction of the second connection portion 623 of the third ground terminal G3 and the extending direction of the second connection portion 623 of the fourth ground terminal G4, respectively, so as to achieve multi-position contact. Therefore, the reliability of the contact between the third metal shield 63 and the third ground terminals G3 and the fourth ground terminals G4 is improved. In the illustrated embodiment of the present disclosure, a wall thickness of the fifth rib 6331, a wall thickness of the sixth rib 6332, and a wall thickness of a portion of the third main body portion 631 located between the fifth rib 6331 and the sixth rib 6332 are the same.

In addition, the third main body portion 631 further includes a plurality of third protruding pieces 6312 extending downwardly from a bottom edge thereof and a plurality of connecting pieces 6313 each of which is located between two adjacent third protruding pieces 6312. By providing the third protruding pieces 6312, the shielding length can be extended, and the shielding effect on the second signal terminals S2 can be improved. In the illustrated embodiment of the present disclosure, the connecting pieces 6313 are stamped from the third main body portion 631. The connecting piece 6313 straddles the corresponding slot 6231 to connect one side of the first end portion 6232 and the second end portion 6233 of the same third ground terminal G3, thereby improving the shielding effect. At the same time, the connecting piece 6313 can also connect one side of the first end portion 6232 and the second end portion 6233 of the same fourth ground terminal G4, thereby improving the shielding effect.

In the illustrated embodiment of the present disclosure, there are multiple third extension portions 632 which are disposed at intervals. The third extension portions 632 are used to be inserted into the first slots 6612 and the second slots 6632 of the metal shell 66 to achieve contact and improve the shielding effect.

Figure 30:
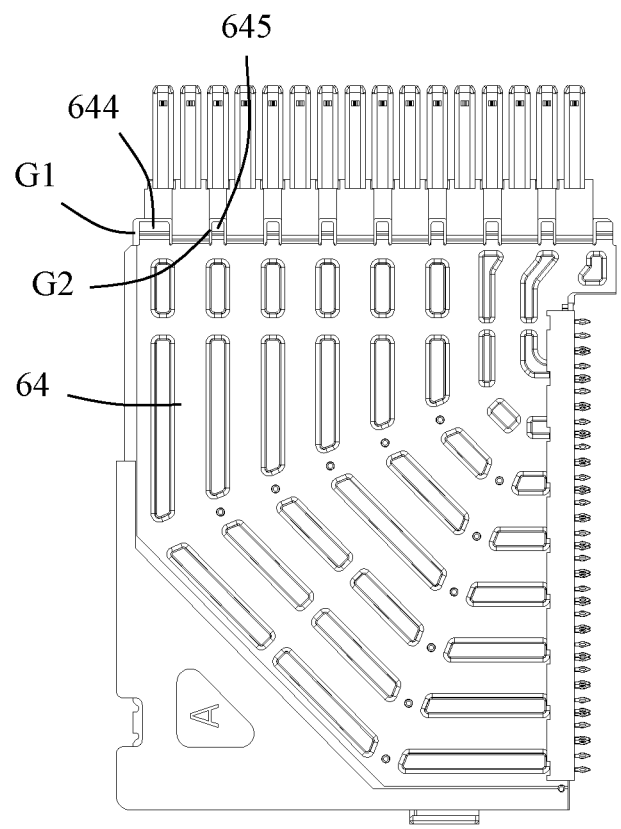
FIG. 30 is a top view of the second backplane connector with the second spacer in FIG. 28 removed.
Figure 42:
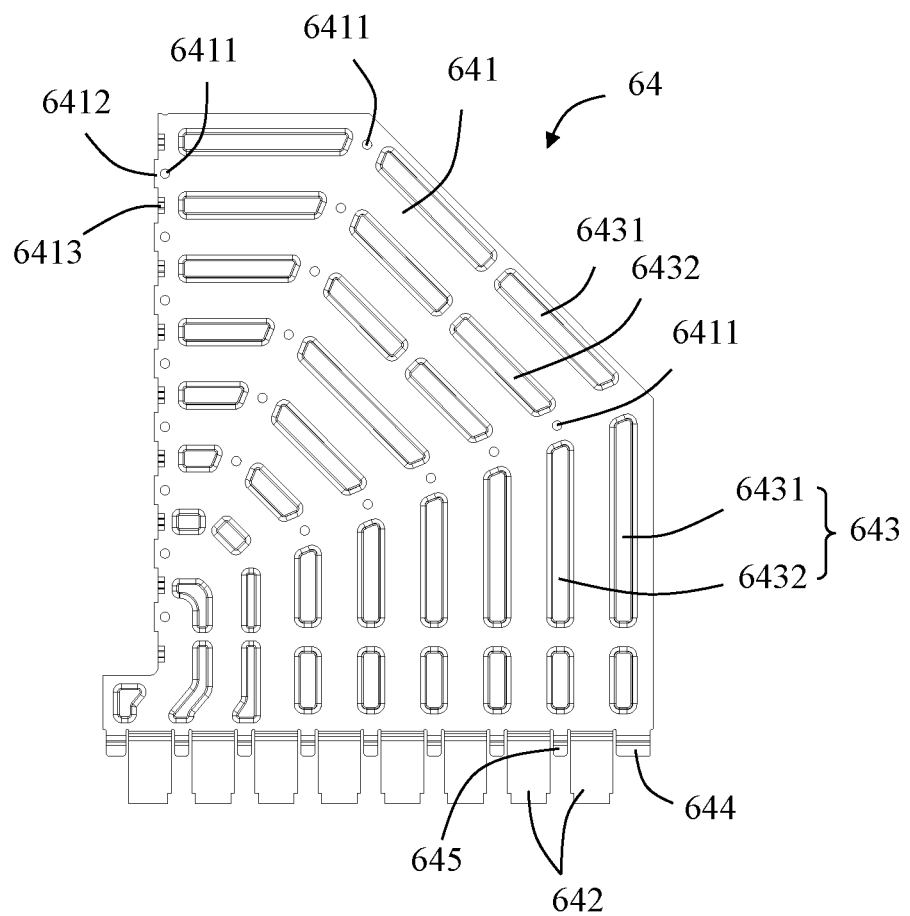
FIG. 42 is a side view of a fourth metal shield of the second backplane connector.

Similarly, referring to FIGS. 30, 36 and 42, the fourth metal shield 64 includes a fourth main body portion 641, a fourth extension portion 642 extending from the fourth main body portion 641, and a third elastic arm 644 and a fourth elastic arm 645 which are respectively located on both sides of the fourth extension portion 642. The third elastic arm 644 and the fourth elastic arm 645 extend beyond the fourth main body portion 641 to contact the third ground terminal G3 and the fourth ground terminal G4, respectively. The fourth main body portion 641 is located on the other side of the second connection portion 623 of the second conductive terminal 62. In the illustrated embodiment of the present disclosure, the fourth extension portion 642 and the fourth main body portion 641 are located in different planes, in which the fourth extension portion 642 is farther away from the third metal shield 63 than the fourth main body portion 641. The fourth main body portion 641 includes a plurality of fourth mounting holes 6411 for mating with the plurality of fourth posts 6162. The fourth posts 6162 are fixed and positioned in the fourth mounting holes 6411 by soldering. The fourth main body portion 641 includes a plurality of ribs 643. The ribs 643 include a plurality of seventh ribs 6431 protruding toward the third ground terminal G3 and a plurality of eighth ribs 6432 protruding toward the fourth ground terminal G4. The seventh ribs 6431 are disposed along the extending direction of the second connection portion 623 of the third ground terminal G3. The eighth ribs 6432 are disposed along the extending direction of the second connection portion 623 of the fourth ground terminal G4. In the illustrated embodiment of the present disclosure, the seventh ribs 6431 and the eighth ribs 6432 are formed by stamping the fourth main body portion 641. The seventh ribs 6431 and the eighth ribs 6432 protrude toward the third metal shield 63. The seventh ribs 6431 and the eighth ribs 6432 are disposed discontinuously along the extending direction of the second connection portion 623 of the third ground terminal G3 and the extending direction of the second connection portion 623 of the fourth ground terminal G4, respectively, so as to achieve multi-position contact. Therefore, the contact reliability between the fourth metal shield 64 and the third ground terminals G3 and the fourth ground terminals G4 is improved. In the illustrated embodiment of the present disclosure, a wall thickness of the seventh rib 6431, a wall thickness of the eighth rib 6432, and a wall thickness of a portion of the fourth main body portion 641 located between the seventh rib 6431 and the eighth rib 6432 are the same.

In an embodiment of the present disclosure, soldering is performed on the surfaces of the ribs 633 and the ribs 643 to solder the ribs 633 and the ribs 643 to the third ground terminals G3 and the fourth ground terminals G4. For example, soldering is performed on the surfaces of the fifth ribs 6331, the sixth ribs 6332, the seventh ribs 6431 and the eighth ribs 6432 so that the fifth ribs 6331, the sixth ribs 6332, the seventh ribs 6431 and the eighth ribs 6432 are soldered to the third ground terminals G3 and the fourth ground terminals G4. The soldering method is at least one of spot soldering, laser soldering and ultrasonic soldering.

In addition, the fourth main body portion 641 further includes a plurality of fourth protruding pieces 6412 extending downwardly from a bottom edge thereof, and a plurality of connecting pieces 6413 each of which is located between two adjacent fourth protruding pieces 6412. By providing the fourth protruding pieces 6412, the shielding length can be extended, and the shielding effect on the second signal terminals S2 can be improved. In the illustrated embodiment of the present disclosure, the connecting pieces 6413 is stamped from the fourth main body portion 641. The connecting piece 6413 straddles the corresponding slot 6231 to connect the first end 6232 and the other side of the second end 6233 of the same third ground terminal G3 so as to improve the shielding effect. At the same time, the connecting piece 6413 can also connect the first end portion 6232 and the other side of the second end portion 6233 of the same fourth ground terminal G4 so as to improve the shielding effect.

In the illustrated embodiment of the present disclosure, there are multiple fourth extension portions 642 which are disposed at intervals. The fourth extension portions 642 are used to be inserted into the first slots 6612 and the second slots 6632 of the metal shell 66 so as to achieve contact and improve the shielding effect.

Figure 44:
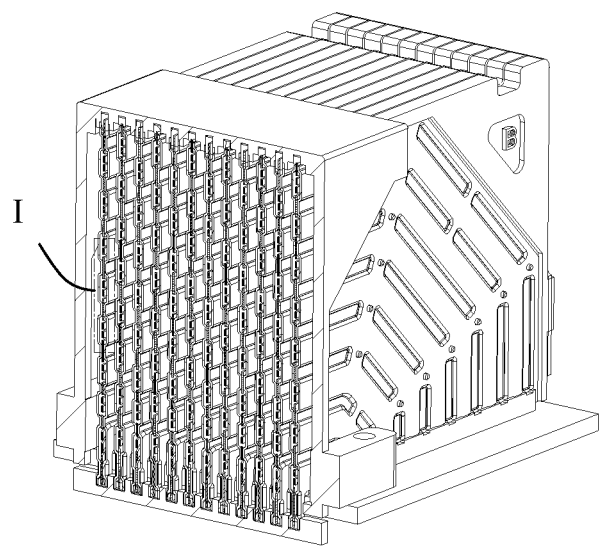
FIG. 44 is a partial perspective cross-sectional view taken along line C'-C' in FIG. 2.
Figure 45:
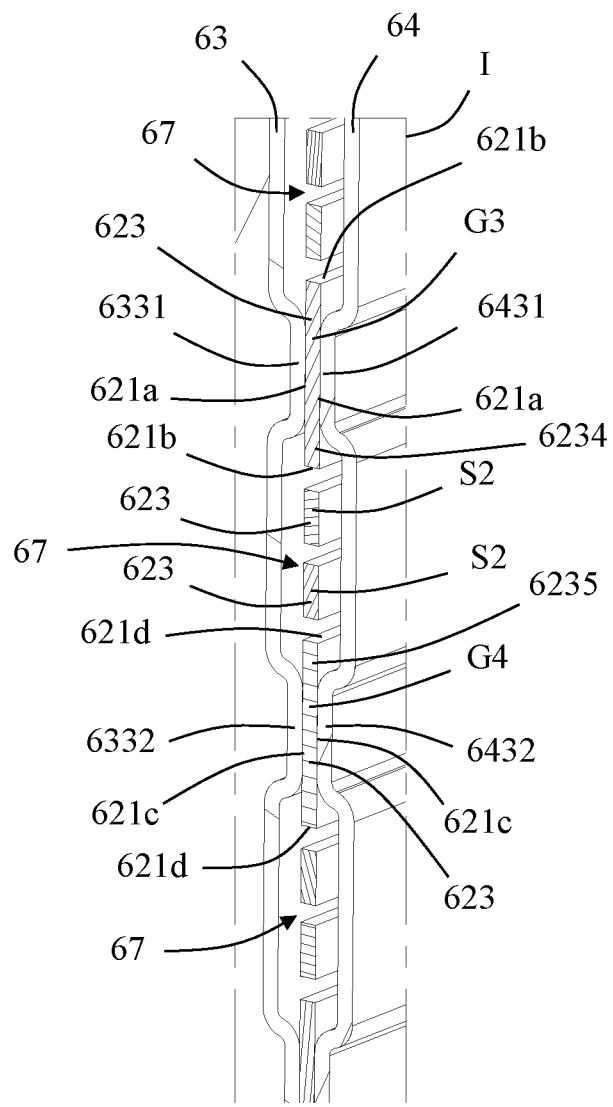
FIG. 45 is a partial enlarged view of a frame portion I in FIG. 44.
Figure 46:
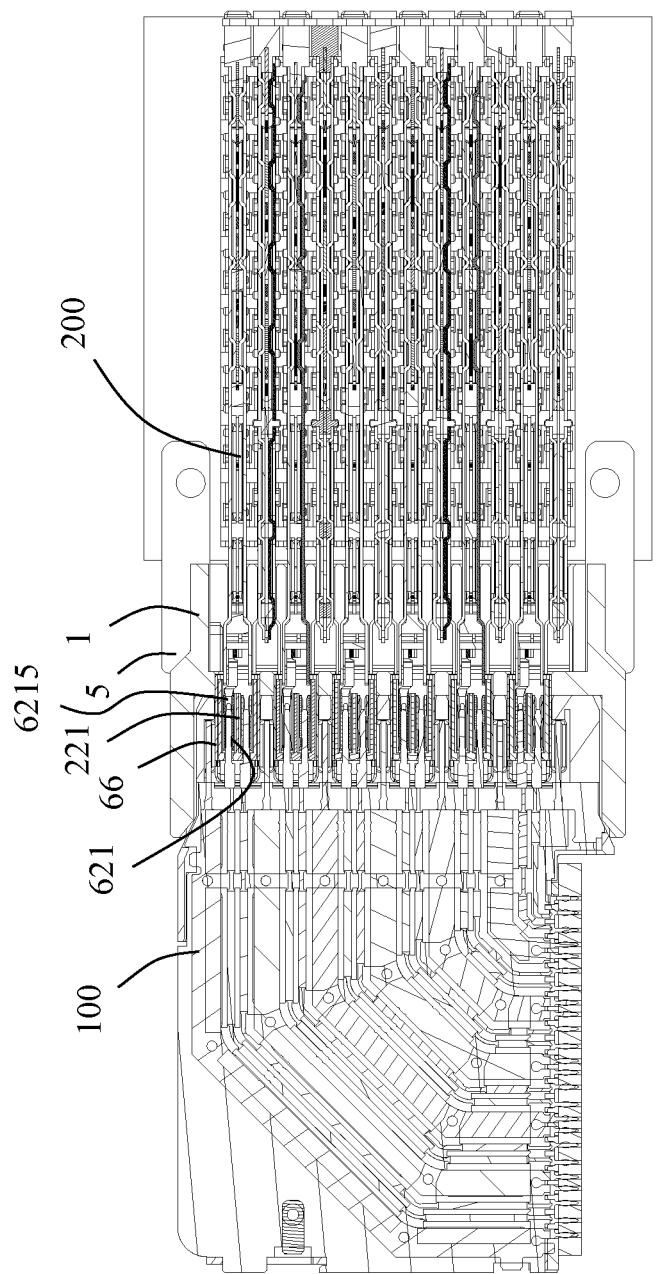
FIG. 46 is a schematic cross-sectional view taken along line J-J in FIG. 1.
Figure 47:
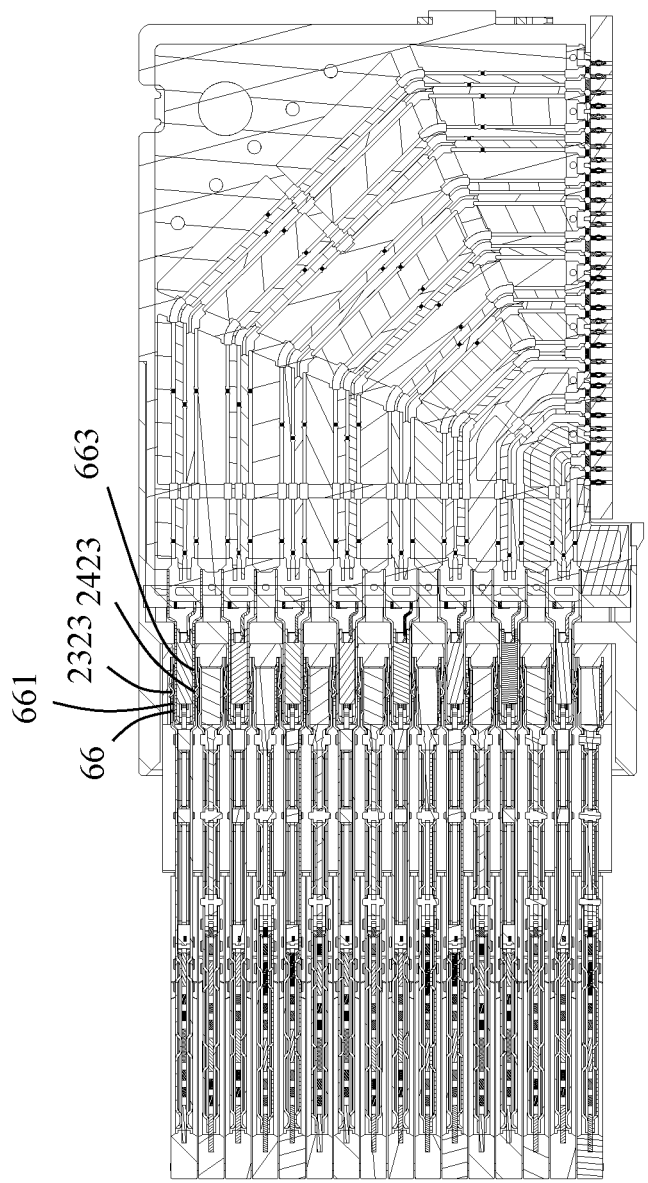
FIG. 47 is a schematic cross-sectional view taken along line K-K in FIG. 1.
Figure 48:
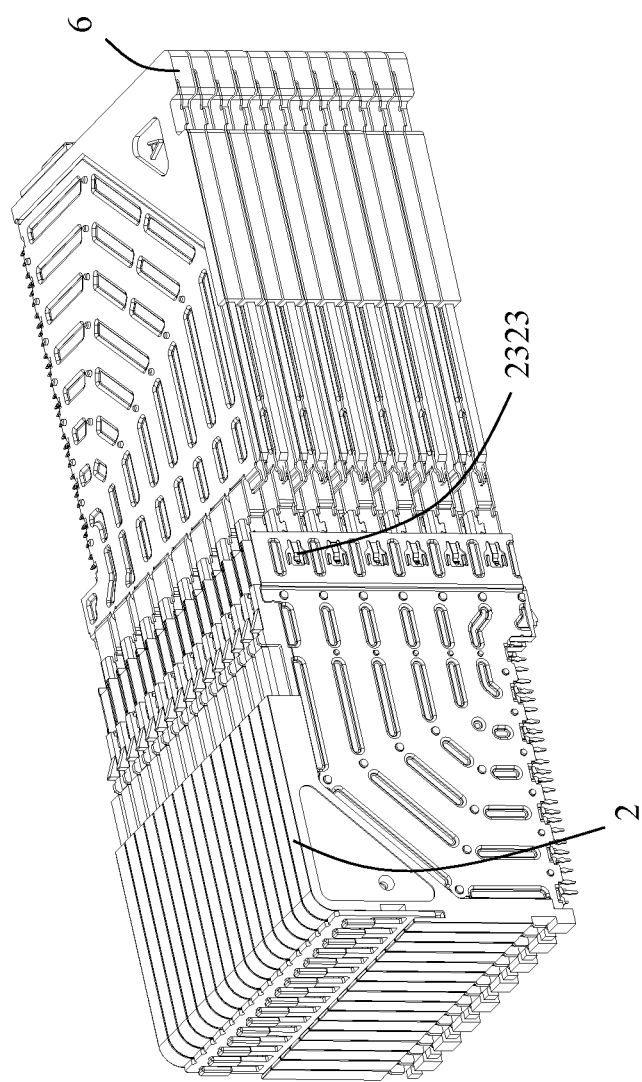
FIG. 48 is a perspective schematic view of the first wafer of the first backplane connector and the second wafer of the second backplane connector when mating.

Referring to FIGS. 44 and 45, in the length of the second connection portion 623 of the second conductive terminal 62, the fifth rib 6331 of the third metal shield 63 and the seventh rib 6431 of the fourth metal shield 64 are in contact with two opposite side surfaces of the second connection portion 623 of the third ground terminal G3, respectively. The sixth rib 6332 of the third metal shield 63 and the eighth rib 6432 of the fourth metal shield 64 are in contact with two opposite side surfaces of the second connection portion 623 of the fourth ground terminal G4, respectively. As a result, a shielding cavity 67 surrounding the outer periphery of the second connection portion 623 of each pair of second differential signal terminals is formed. In the illustrated embodiment of the present disclosure, the fifth rib 6331 and the seventh rib 6431 contact the first wide surface 621a of the second connection portion 623 of the third ground terminal G3, respectively. The sixth rib 6332 and the eighth rib 6432 contact the second wide surface 621c of the second connection portion 623 of the fourth ground terminal G4, respectively. In the illustrated embodiment of the present disclosure, the shielding cavity 67 is formed by the third main body portion 631, the fourth main body portion 641, the third ground terminal G3 and the fourth ground terminal G4. The second connection portion 623 of the third ground terminal G3 includes a third tab portion 6234 extending into the shielding cavity 67. The second connection portion 623 of the fourth ground terminal G4 includes a fourth tab portion 6235 extending into the shielding cavity 67. The second connection portions 623 of the second differential signal terminals are located between the third tab portion 6234 and the fourth tab portion 6235. In the illustrated embodiment of the present disclosure, there are a plurality of shielding cavities 67 which are disposed along an arrangement direction of each group of the second conductive terminals 62. Two adjacent shielding cavities 67 share a single third ground terminal G3 or a single fourth ground terminal G4. Taking the shared third ground terminal G3 as an example, a part of the shared third ground terminal G3 protrudes into one shielding cavity 67, and another part of the shared third ground terminal G3 protrudes into another shielding cavity 67.

At a position adjacent to the second contact portion 621 of the second conductive terminal 62, the third extension portion 632 and the fourth extension portion 642 are both inserted into the first slot 6612 and the second slot 6632 of the metal shell 66. The first extension piece 6611 and the second extension piece 6631 of the metal shell 66 are respectively inserted into the first notch 6216 of the third ground terminal G3 and the second notch 6217 of the fourth ground terminal G4. At the same time, the first elastic arm 634 of the third metal shield 63 and the third elastic arm 644 of the fourth metal shield 64 clamp both sides of the second contact portion 621 of the third ground terminal G3. The second elastic arm 635 of the third metal shield 63 and the fourth elastic arm 645 of the fourth metal shield 64 clamp both sides of the second contact portion 621 of the fourth ground terminal G4. Specifically, the first elastic arm 634 and the third elastic arm 644 clamp the first wide surface 621a of the third ground terminal G3. The second elastic arm 635 and the fourth elastic arm 645 clamp the second wide surface 621c of the fourth ground terminal G4. With this arrangement, the third metal shield 63, the fourth metal shield 64, the metal shell 66, the third ground terminal G3, and the fourth ground terminal G4 are all connected in series, thereby the shielding area is increased and the shielding effect is improved.

In the illustrated embodiment of the present disclosure, there are multiple second wafers 6 of the second backplane connector 200, and the terminal arrangement of two adjacent second wafers 6 are staggered. Correspondingly, the shielding cavities 67 of two adjacent second wafers 6 are also staggered. When the second wafer 6 is assembled to the second header 5, the metal shell 66 of the second wafer 6 passes through the corresponding second terminal receiving groove 511 so as to extend into the receiving space 535.

Figure 28:
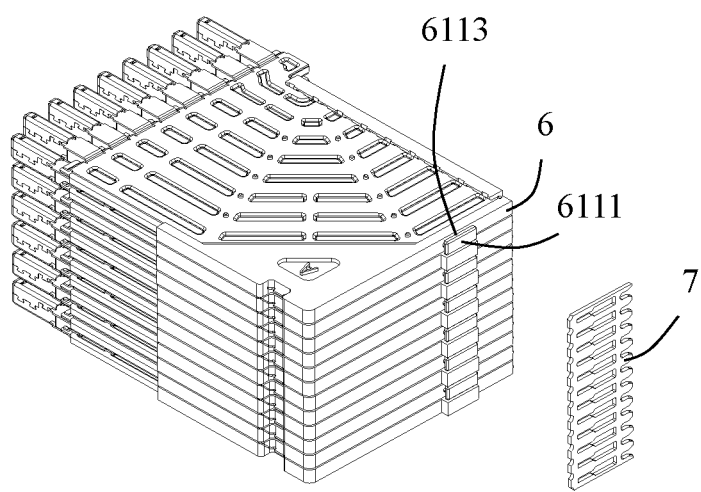
FIG. 28 is a partially exploded perspective view of the second backplane connector, in which a second spacer is separated.
Figure 29:
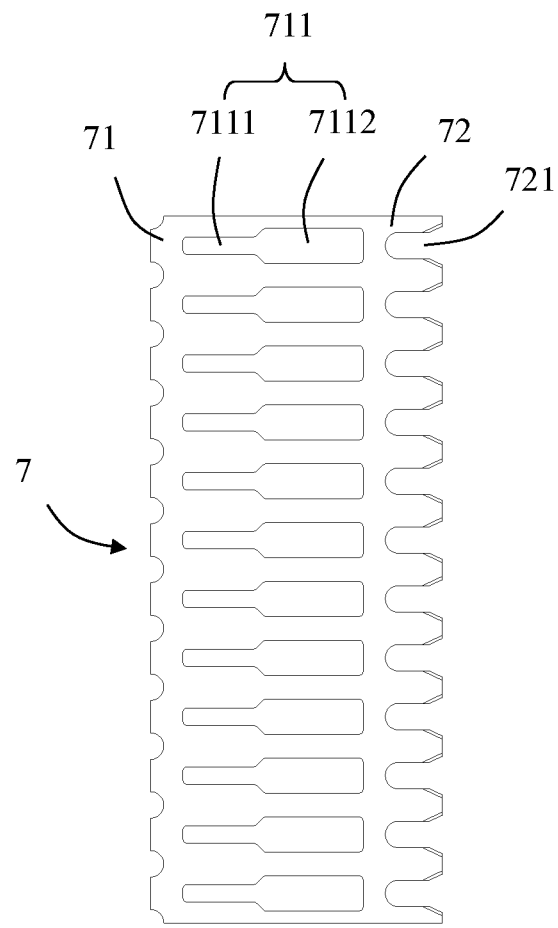
FIG. 29 is a front view of the second spacer in FIG. 28.

Referring to FIGS. 28 and 29, in the illustrated embodiment of the present disclosure, the second spacer 7 is made of metal material or insulating material. The second spacer 7 includes a body portion 71 and a protruding piece 72 extending from the body portion 71. The body portion 71 includes a plurality of slots 711 corresponding to the first protrusions 6111. The protruding piece 72 includes a plurality of slits 721, so that the protruding piece 72 is roughly comb-shaped. Each slot 711 is a closed slot, which means the circumference of the slot 711 is surrounded by the body portion 71. The slit 721 is a non-closed slit, which means one end of the slit 721 is opened. The slit 721 is in alignment with the corresponding slot 711 along the vertical direction. Each slot 711 includes a first slot 7111 and a second slot 7112 of which a width is greater than that of the first slot 7111. The first slot 7111 is located at one side of the second slot 7112 and communicates with the corresponding second slot 7112. The slit 721 is located on the other side of the second slot 7112.

When assembling the second spacer 7 to the plurality of second wafers 6, firstly, the second slots 7112 of the second spacer 7 are corresponding to the first protrusions 6111 along the extending direction of the second contact portion 621, and make the first protrusions 6111 pass through the second slots 7112. Then, the second spacer 7 is moved along the extending direction of the second tail portions 622, so that the first constriction portions 6113 are tightly clamped in the first slots 7111. As a result, all the second wafers 6 can be combined into a whole so as to prevent loosening and prevent the second wafers 6 from being separated from the second spacer 7 along the extending direction of the second contact portions 621.

Figure 31:
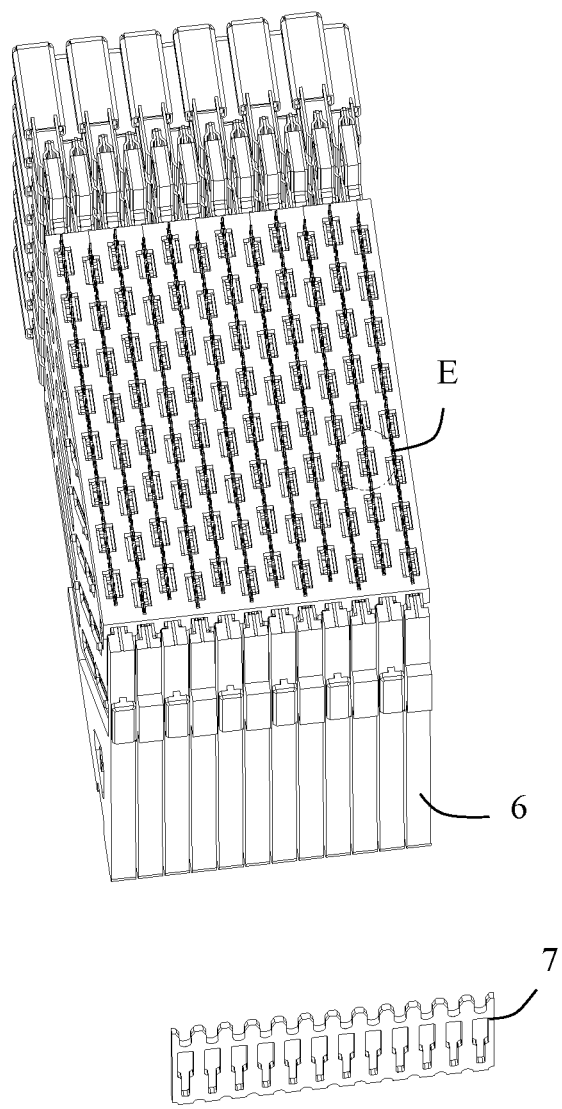
FIG. 31 is a partially exploded perspective view of FIG. 28 from another angle.
Figure 32:
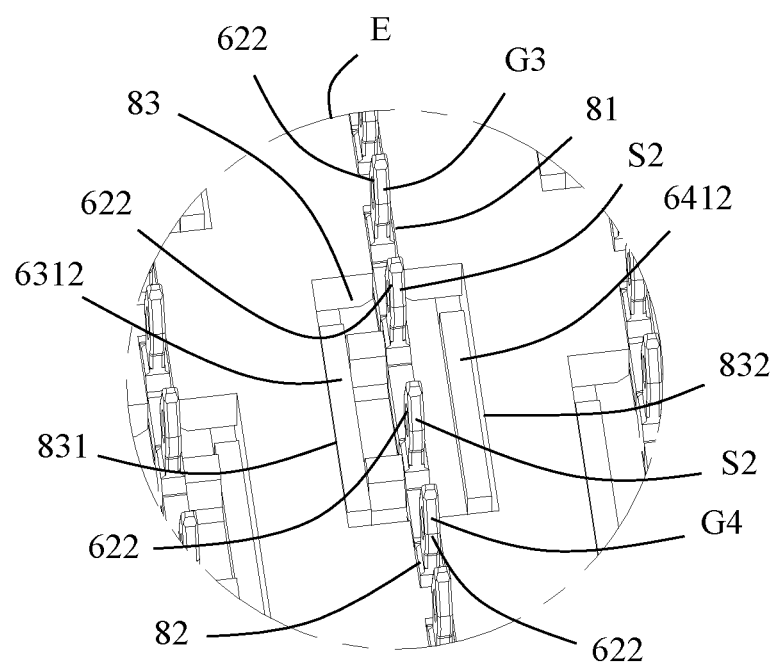
FIG. 32 is a partial enlarged view of a circled part E in FIG. 31.
Figure 33:
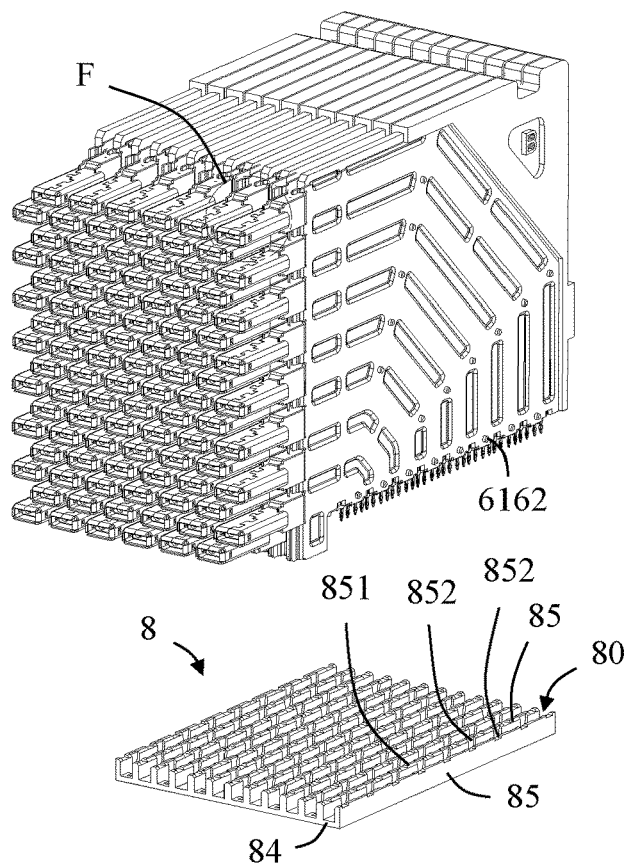
FIG. 33 is a partial perspective exploded view of the second backplane connector, in which a second mounting block is separated.

Referring to FIGS. 31 to 33, the second mounting block 8 is similar in structure to the first mounting block 4. The second mounting block 8 includes a plurality of first through holes 81 for allowing the second tail portions 622 of the third ground terminals G3 to pass through, a plurality of second through holes 82 for allowing the second tail portions 622 of the fourth ground terminals G4 to pass through, and a plurality of slots 83 for allowing the second tail portions 622 of the second signal terminals S2 to pass through. For a group of second conductive terminals 62 arranged in the manner of G3-S2-S2-G4, the first through hole 81 and the second through hole 82 are located on opposite sides of the slot 83 and are in communication with the slot 83. A width of the slot 83 is greater than a width of the first through hole 81 and a width of the second through hole 82, so that the second tail portions 622 of the second differential signal terminals can be completely exposed in the slot 83. The second mounting block 8 further includes a first abutting surface 831 located on one side of the slot 83 and a second abutting surface 832 located on the other side of the slot 83. The first abutting surface 831 and the second abutting surface 832 are disposed opposite to each other. The third protruding piece 6312 of the third metal shield 63 and the fourth protruding piece 6412 of the fourth metal shield 64 are at least partially inserted into the slots 83. In the illustrated embodiment of the present disclosure, the third protruding piece 6312 of the third metal shield 63 abuts against the first abutting surface 831. The fourth protruding piece 6412 of the fourth metal shield 64 abuts against the second abutting surface 832. Along an arrangement direction of the group of second conductive terminals 62 arranged in the manner of G3-S2-S2-G4, the second tail portions 622 of the second differential signal terminals are located between the second tail portion 622 of the third ground terminal G3 and the second tail portion 622 of the fourth ground terminal G4. Along the direction perpendicular to the arrangement direction, the second tail portions 622 of the second differential signal terminals are located between the third protruding piece 6312 of the third metal shield 63 and the fourth protruding piece 6412 of the fourth metal shield 64. This arrangement improves the shielding effect of the second differential signal terminals. In an embodiment of the present disclosure, the second mounting block 8 is made of electroplated plastic so as to further improve the shielding effect.

Referring to FIG. 33, the second mounting block 8 further includes a mounting wall 84 and a plurality of side walls 85 perpendicular to the mounting wall 84. The side walls 85 are spaced apart and parallel to each other, and a plurality of slots 80 for insertion of the second wafers 6. Each slot 80 is formed between two adjacent side walls 85. A top of the side wall 85 includes a second inclined surface 851 communicating with the slot 80 and acting as an insertion guide. The second inclined surfaces 851 of the two side walls 85 located on opposite sides of the slot 80 have different inclination directions so as to form a bell-mouth opening. The bell-mouth opening is used to facilitate the insertion of the second wafers 6 or to facilitate to mount the second mounting block 8 to the second wafers 6. An inner side of the side wall 85 also includes a plurality of positioning grooves 852 communicating with the slot 80 and used for positioning the third posts 6161 and the fourth posts 6162 which are located on the second bottom wall 614 of the second insulating frame 61.

Referring to FIGS. 1, 2, 26 and 46 to 48, when the first backplane connector 100 is mated with the second backplane connector 200, the first header 1 of the first backplane connector 100 is inserted into the receiving space 535 of the second header 5 of the second backplane connector 200. The metal shells 66 of the second wafers 6 of the second backplane connector 200 are inserted into the shielding spaces 27 of the first wafers 2 of the first backplane connector 100. At this time, the positioning protrusions 14 of the first header 1 are received in the positioning grooves 530 of the second header 5. The first elastic pieces 2323 of the first metal shields 23 and the second elastic pieces 2423 of the second metal shields 24 of the first backplane connector 100 contact the corresponding first side wall 661 and the corresponding third side wall 663 of the metal shells 66 of the second backplane connector 200. The first contact portions 221 of the first wafers 2 are inserted into the mating holes 6215 of the second wafers 6 so as to make contact with the second contact portions 621.

Figure 49:
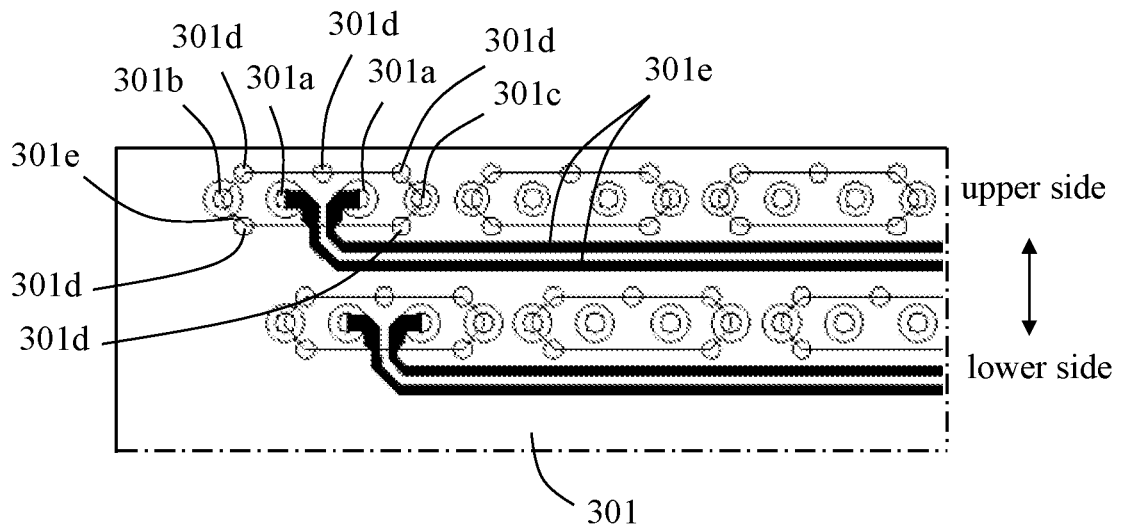
FIG. 49 is a partial schematic view of a first circuit board.

Referring to FIG. 49, for each group of first conductive terminals 22 arranged in the manner of G1-S1-S1-G2, the first circuit board 301 includes two first insertion holes 301a for mating with the first tail portions 222 of the first differential signal terminals, a second insertion hole 301b for mating with the first tail portion 222 of the first ground terminal G1, and a third insertion hole 301c for mating with the first tail portion 222 of the second ground terminal G2. The second insertion hole 301b and the third insertion hole 301c are respectively located on two sides (for example, a left side and a right side) of the first insertion holes 301a. The first circuit board 301 also includes a plurality of grounding points 301d distributed on the periphery of the first insertion holes 301a and located between the outer edges of the second insertion hole 301b and the third insertion hole 301c. The grounding point 301d, together with the second insertion hole 301b and the third insertion hole 301c, form a shielding layer 301e surrounding the periphery of the first insertion holes 301a. In the illustrated embodiment of the present disclosure, the grounding points 301d may be connected through conductive paths of the first circuit board 301 so as to improve the shielding effect. Of course, in other embodiments, the grounding points 301d are discrete points and are not physically connected to each other. However, these grounding points 301d may also form the shielding layer 301e by coupling. Specifically, the second insertion hole 301b is disposed on one side (for example, the left side) of the two first insertion holes 301a. The third insertion hole 301c is disposed on the other side (for example, the right side) of the two first insertion holes 301a. The two first insertion holes 301a, the second insertion hole 301b and the third insertion hole 301c are disposed along the same baseline. The plurality of grounding points 301d are disposed on at least one side (for example, an upper side or a lower side) of the baseline. In the illustrated embodiment of the present disclosure, the plurality of grounding points 301d are located on the first side (for example, the upper side) and the second side (for example, the lower side) of the baseline. The baseline is located between the first side and the second side. The number of grounding points 301d located on the first side is greater than the number of grounding points 301d located on the second side. Specifically, the number of the grounding points 301d located on the first side is at least three. The number of the grounding points 301d located on the second side is at least two. In addition, the first circuit board 301 also includes a plurality of conductive wires 301f. The plurality of conductive wires 301f are electrically connected with the two first insertion holes 301a. The plurality of conductive wires 301f pass between at least two grounding points 301d on the second side.

In the illustrated embodiment of the present disclosure, the first tail portions 222 of the first differential signal terminals of the first backplane connector 100 pass through the first insertion holes 301a and are electrically connected to the first circuit board 301 by soldering. The first tail portion 222 of the first ground terminal G1 passes through the second insertion hole 301b and is electrically connected to the first circuit board 301 by soldering. The first tail portion 222 of the second ground terminal G2 passes through the third insertion hole 301c and is electrically connected to the first circuit board 301 by soldering.

Figure 50:
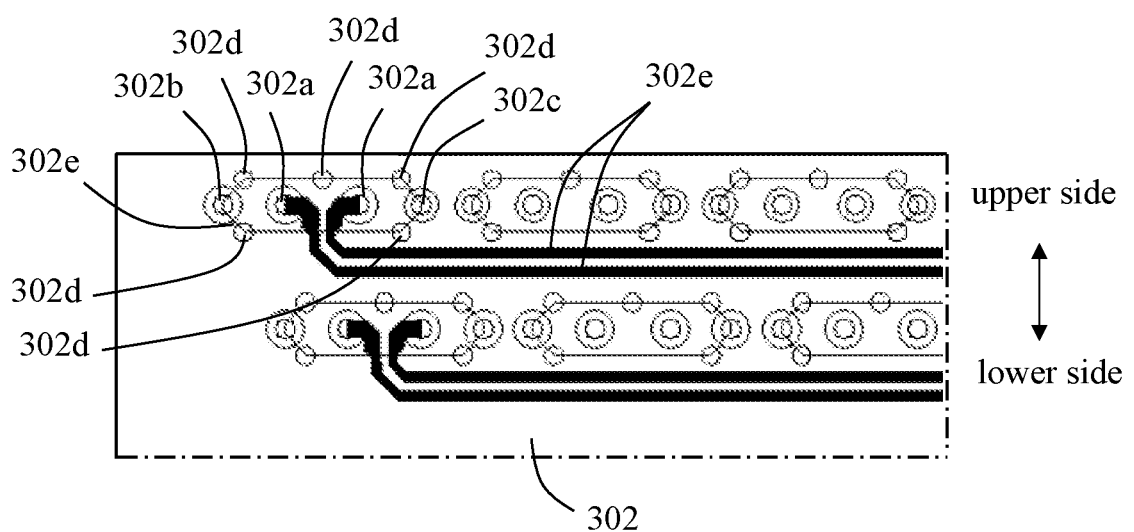
FIG. 50 is a partial schematic view of a second circuit board.

Similarly, referring to FIG. 50, for each group of second conductive terminals 62 arranged in G3-S2-S2-G4, the second circuit board 302 includes two first insertion holes 302a for mating with the second tail portions 622 of the second differential signal terminals, a second insertion hole 302b for mating with the second tail portion 622 of the third ground terminal G3, and a third insertion hole 302c for mating with the second tail portion 622 of the fourth ground terminal G4. The second insertion hole 302b and the third insertion hole 302c are respectively located on two sides of the first insertion holes 302a. The second circuit board 302 also includes a plurality of grounding points 302d distributed around the periphery of the first insertion hole 302a and located between the outer edges of the second insertion hole 302b and the third insertion hole 302c. The grounding point 302d, together with the second insertion hole 302b and the third insertion hole 302c, form a shielding layer 302e surrounding the periphery of the first insertion holes 302a. In the illustrated embodiment of the present disclosure, the grounding point 302d may be connected through conductive paths of the second circuit board 302 so as to improve the shielding effect. Of course, in other embodiments, the grounding points 302d are discrete points and are not physically connected to each other. However, these grounding points 302d may also form the shielding layer 302e by coupling. Specifically, the second insertion hole 302b is disposed on one side (for example, the left side) of the two first insertion holes 302a. The third insertion hole 302c is disposed on the other side (for example, the right side) of the two first insertion holes 302a. The two first insertion holes 302a, the second insertion hole 302b and the third insertion hole 302c are disposed along the same baseline. The plurality of grounding points 302d are disposed on at least one side (for example, the upper side or the lower side) of the baseline. In the illustrated embodiment of the present disclosure, the plurality of grounding points 302d are disposed on the first side (for example, the upper side) and the second side (for example, the lower side) of the baseline. The baseline is located between the first side and the second side. The number of grounding points 302d located on the first side is greater than the number of grounding points 302d located on the second side. Specifically, the number of the grounding points 302d located on the first side is at least three. The number of the grounding points 302d located on the second side is at least two. In addition, the second circuit board 302 also includes a plurality of conductive wires 302f. The plurality of conductive wires 302f are electrically connected to the two first insertion holes 302a. The plurality of conductive wires 302f pass between at least two grounding points 302d on the second side.

In the illustrated embodiment of the present disclosure, the second tail portion 622 of the second conductive terminal 62 of the second backplane connector 200 includes a fisheye hole. The second tail portions 622 of the second differential signal terminals are pressed into the first insertion hole 302a to be electrically connected to the second circuit board 302. The second tail portion 622 of the third ground terminal G3 is pressed into the second insertion hole 302b to be electrically connected to the second circuit board 302. The second tail portion 622 of the fourth ground terminal G4 is pressed into the third insertion hole 302c to be electrically connected to the second circuit board 302.

The above embodiments are only used to illustrate the present disclosure and not to limit the technical solutions described in the present disclosure. The understanding of this specification should be based on those skilled in the art. Descriptions of directions, although they have been described in detail in the above-mentioned embodiments of the present disclosure, those skilled in the art should understand that modifications or equivalent substitutions can still be made to the application, and all technical solutions and improvements that do not depart from the spirit and scope of the application should be covered by the claims of the application.

What is claimed is:

1. A backplane connector assembly, comprising a first backplane connector and a second backplane connector mateable with the first backplane connector, the first backplane connector comprising a first wafer, the first wafer comprising:
  a plurality of first conductive terminals each comprising a first connection portion and a first contact portion;
  a first insulating frame, the first insulating frame being fixed with the first connection portion;
  a first metal shield, the first metal shield comprising a first extension portion; and
  a second metal shield, the second metal shield comprising a second extension portion;
  wherein the first conductive terminals comprise first differential signal terminals, a first ground terminal and a second ground terminal; and wherein the first differential signal terminals are located between the first ground terminal and the second ground terminal;
  the second backplane connector comprising a second wafer, and the second wafer comprising:
  a plurality of second conductive terminals each comprising a second connection portion and a second contact portion;
  a second insulating frame, the second insulating frame being fixed with the second connection portion;
  a third metal shield, the third metal shield comprising a third extension portion; and
  a fourth metal shield, the fourth metal shield comprising a fourth extension portion;
  wherein the second conductive terminals comprise second differential signal terminals, a third ground terminal and a fourth ground terminal; and wherein the second differential signal terminals are located between the third ground terminal and the fourth ground terminal;
  wherein the first extension portion comprises a first elastic piece, and the second extension portion comprises a second elastic piece;
  wherein the second contact portions of the second differential signal terminals extend beyond the third extension portion and the fourth extension portion, the second wafer comprises an insulating block sleeved on the second contact portions of the second differential signal terminals and a metal shell sleeved on the insulating block, and the metal shell is in contact with the third extension portion and the fourth extension portion; and wherein when the first backplane connector is mated with the second backplane connector, the first contact portions are in contact with the second contact portions, and the first elastic piece and the second elastic piece are respectively in contact with the metal shell.

2. The backplane connector assembly according to claim 1, wherein the first extension portion comprises a first bulge protruding toward the first ground terminal, and a second bulge protruding toward the second ground terminal;

the second extension portion comprises a third bulge protruding toward the first ground terminal and a fourth bulge protruding toward the second ground terminal;

the first bulge and the third bulge respectively contact opposite side surfaces of the first contact portion of the first ground terminal, and the second bulge and the fourth bulge respectively contact opposite side surfaces of the first contact portion of the second ground terminal;

wherein the first extension portion, the second extension portion, the first ground terminal and the second ground terminal jointly form a shielding space which surrounds the first contact portions of the first differential signal terminals; and wherein the metal shell is at least partially received in the shielding space.

3. The backplane connector assembly according to claim 2, wherein the first connection portions of the first differential signal terminals, the first connection portion of the first ground terminal and the first connection portion of the second ground terminal are located in a first plane;

wherein the first ground terminal comprises a first torsion portion which connects the first connection portion of the first ground terminal and the first contact portion of the first ground terminal;

wherein the second ground terminal comprises a second torsion portion which connects the first connection portion of the second ground terminal and the first contact portion of the second ground terminal; and wherein the first contact portion of the first ground terminal and the first contact portion of the second ground terminal are parallel and perpendicular to the first plane.

4. The backplane connector assembly according to claim 3, wherein the first contact portion of the first ground terminal comprises two first wide surface and two first narrow surface; the first contact portion of the second ground terminal comprises two second wide surface and two second narrow surface; the first bulge and the third bulge contact the first narrow surfaces of the first ground terminal, respectively; and the second bulge and the fourth bulge contact the second narrow surfaces of the second ground terminal, respectively.

5. The backplane connector assembly according to claim 1, wherein the first metal shield comprises a first main body portion connected to the first extension portion, the first main body portion comprises a first rib protruding toward the first ground terminal and a second rib protruding toward the second ground terminal;

wherein the second metal shield comprises a second main body portion connected to the second extension portion, the second main body portion comprises a third rib protruding toward the first ground terminal and a fourth rib protruding toward the second ground terminal; and wherein the first rib and the third rib respectively contact opposite side surfaces of the first connection portion of the first ground terminal, the second rib and the fourth rib respectively contact opposite side surfaces of the first connection portion of the second ground terminal, and the first main body portion, the second main body portion, the first ground terminal and the second ground terminal jointly form a shielding cavity surrounding the first connection portions of the first differential signal terminals.

6. The backplane connector assembly according to claim 1, wherein the insulating block comprises a mating surface and two through holes extending through the mating surface, the two through holes are adapted to receive the second contact portions of the second differential signal terminals, and the second contact portions of the second differential signal terminals comprise a mating hole to receive the first contact portions of the first differential signal terminals.

7. The backplane connector assembly according to claim 6, wherein the second contact portions of the second differential signal terminals comprise a first contact section, a second contact section, and a slot located between the first contact section and the second contact section; and Wherein the slot is in communication with the mating hole.

8. The backplane connector assembly according to claim 1, wherein the metal shell comprises a first side wall, a second side wall, a third side wall and a fourth side wall which are connected in sequence;

wherein the first side wall is opposite to the third side wall, and the second side wall is opposite to the fourth side wall; and wherein the insulating block is fixed in the metal shell.

9. The backplane connector assembly of claim 8, wherein each end of the first side wall, the second side wall, the third side wall and the fourth side wall comprises a deflection portion bent inwardly so as to form a constriction portion at an end of the metal shell.

10. The backplane connector assembly according to claim 8, wherein the metal shell further comprises a first extension piece extending and protruding from the first side wall and two first slots located on opposite sides of the first extension piece;

wherein the metal shell further comprises a second extension piece extending and protruding from the third side wall and two second slots located on opposite sides of the second extension piece; and wherein the third extension portion and the fourth extension portion are inserted into corresponding first slots and corresponding second slots.

11. The backplane connector assembly according to claim 10, wherein the first extension piece is in vertical contact with the second contact portion of the third ground terminal; and wherein the second extension piece is in vertical contact with the second contact portion of the fourth ground terminal.

12. The backplane connector assembly according to claim 10, wherein the second contact portion of the third ground terminal comprises a first notch adjacent to the second differential signal terminals, and the first notch is adapted to receive the first extension piece; and wherein the second contact portion of the fourth ground terminal comprises a second notch adjacent to the second differential signal terminals, and the second notch is adapted to receive the second extension piece.

13. The backplane connector assembly according to claim 8, wherein the second side wall and the fourth side wall respectively comprise restriction protrusions which are stamped inwardly; and the restriction protrusions are mateable with the insulating block so as to prevent the insulating block from being drawn out of the metal shell.

14. The backplane connector assembly according to claim 8, wherein the third metal shield comprises a third main body portion connected to the third extension portion, the third main body portion comprises a fifth rib protruding toward the third ground terminal and a sixth rib protruding toward the fourth ground terminal;
   wherein the fourth metal shield comprises a fourth main body portion connected to the fourth extension portion, the fourth main body portion comprises a seventh rib protruding toward the third ground terminal and an eighth rib protruding toward the fourth terminal;
   wherein the fifth rib and the seventh rib are respectively in contact with opposite side surfaces of the second connection portion of the third ground terminal, the sixth rib and the eighth rib are respectively in contact opposite side surfaces of the second connection portion of the fourth ground terminal, and the third main body portion, the fourth main body portion, the third ground terminal and the fourth ground terminal form a shielding cavity surrounding the second connection portions of the second differential signal terminals.

* * * * *